(12) United States Patent
Kim et al.

(10) Patent No.: US 8,445,343 B2
(45) Date of Patent: May 21, 2013

(54) METHODS OF FABRICATING SEMICONDUCTOR DEVICES INCLUDING SEMICONDUCTOR LAYERS FORMED IN STACKED INSULATING LAYERS

(75) Inventors: Jung Ho Kim, Gyeonggi-do (KR);
Kihyun Hwang, Gyeonggi-do (KR);
Sangryol Yang, Gyeonggi-do (KR);
Yong-Hoon Sang, Gyeonggi-do (KR);
Ju-Eun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 181 days.

(21) Appl. No.: 13/030,729

(22) Filed: Feb. 18, 2011

(65) Prior Publication Data
US 2011/0207304 A1 Aug. 25, 2011

(30) Foreign Application Priority Data
Feb. 22, 2010 (KR) .................. 10-2010-0015842

(51) Int. Cl.
*H01L 21/8242* (2006.01)
*H01L 21/8244* (2006.01)

(52) U.S. Cl.
USPC ........... 438/206; 438/209; 438/212; 257/903; 257/905; 257/906; 257/E21.646; 257/E21.661

(58) Field of Classification Search
USPC .................. 438/206, 209, 212; 257/903, 905, 257/906, E21.646, E21.661
See application file for complete search history.

(56) References Cited

U.S. PATENT DOCUMENTS

| | | | |
|---|---|---|---|
| 6,197,633 B1 | 3/2001 | Schindler et al. | |
| 2006/0091556 A1* | 5/2006 | Shigeoka | 257/773 |
| 2007/0252201 A1* | 11/2007 | Kito et al. | 257/331 |
| 2009/0310425 A1* | 12/2009 | Sim et al. | 365/185.29 |
| 2010/0213526 A1* | 8/2010 | Wada et al. | 257/314 |
| 2010/0230735 A1* | 9/2010 | Zhu | 257/301 |

FOREIGN PATENT DOCUMENTS

| | | |
|---|---|---|
| JP | 2007-180389 | 7/2007 |
| JP | 2009-094237 | 4/2009 |
| KR | 1020090047614 A | 5/2009 |

* cited by examiner

*Primary Examiner* — Thanh V Pham
(74) *Attorney, Agent, or Firm* — Myers Bigel Sibley & Sajovec

(57) ABSTRACT

Methods of fabricating a semiconductor device include alternatingly and repeatedly stacking sacrificial layers and first insulating layers on a substrate, forming an opening penetrating the sacrificial layers and the first insulating layers, and forming a spacer on a sidewall of the opening, wherein a bottom surface of the opening is free of the spacer. A semiconductor layer is formed in the opening. Related devices are also disclosed.

14 Claims, 21 Drawing Sheets

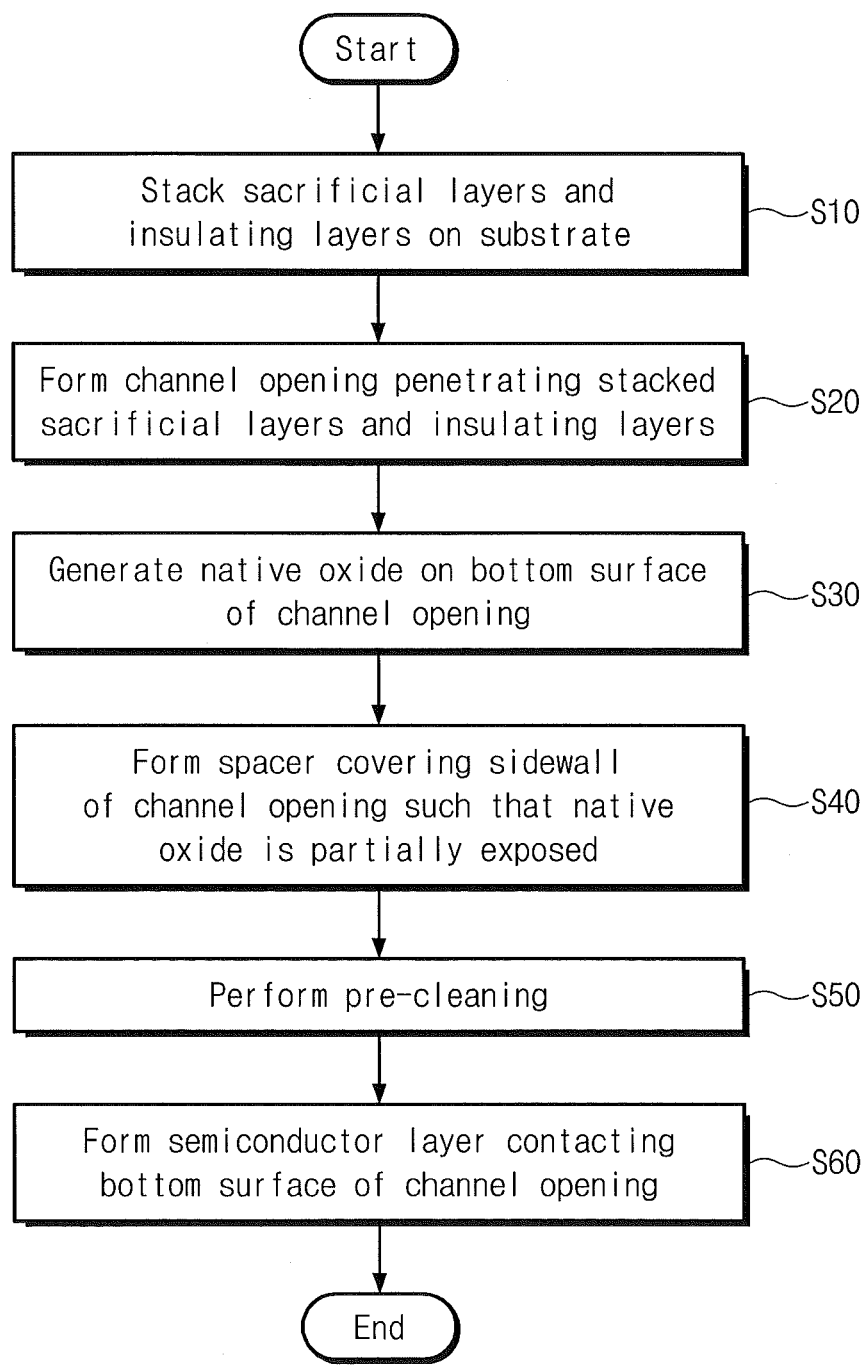

METHODS OF FABRICATING SEMICONDUCTOR DEVICES INCLUDING SEMICONDUCTOR LAYERS FORMED IN STACKED INSULATING LAYERS

CROSS-REFERENCE TO RELATED APPLICATIONS

This U.S. non-provisional patent application claims priority under 35 U.S.C. §119 to Korean Patent Application No. 10-2010-0015842, filed on Feb. 22, 2010, the disclosure of which is hereby incorporated by reference in its entirety.

BACKGROUND

The present disclosure relates to methods of fabricating semiconductor devices.

Advances in the electronics industry have been driven by the rapid increase in the integration degree of semiconductor devices. The integration degree of semiconductor devices, i.e., the density of semiconductor devices that can be formed in a given planar area of a semiconductor substrate, acts as an important factor in determining the product price. That is, higher integration can decrease the product price of semiconductor memory devices. Therefore, the need for higher integration of semiconductor memory devices is increasing.

The integration degree of semiconductor devices is primarily determined by the feature size, i.e. the fineness of patterns that can be achieved using known manufacturing techniques. The feature size directly affects the planar area of a semiconductor substrate that is occupied by an electronic device, such as a unit memory cell. The feature size that can be obtained is greatly influenced by the level of micropattern forming technology that is available. Decreasing the feature size may require the use of extremely expensive semiconductor equipment and/or difficult semiconductor fabricating processes.

SUMMARY

Embodiments of the inventive concepts provide methods for fabricating a semiconductor device. The methods include alternatingly and repeatedly stacking sacrificial layers and insulating layers on a substrate, forming an opening penetrating the sacrificial layers and the insulating layers, and forming a spacer on a sidewall of the opening wherein a bottom surface of the opening is free of the spacer. A semiconductor layer is formed in the opening.

The spacer may be formed on the bottom of the opening, the methods may further include etching the spacer to expose the bottom surface of the opening beneath the spacer while leaving portions of the spacer on the sidewall of the opening. Etching the spacer may include performing a pre-cleaning of the substrate.

In some embodiments, prior to the fanning of the spacer, an oxide layer may be formed on a bottom surface of the opening, and the spacer may be formed on an edge of the oxide layer. At least some of the oxide layer may be removed by the etching.

In some embodiments, the oxide layer may include a native oxide layer.

In still other embodiment, the oxide layer may be completely removed by the etching.

In further embodiments, the etching may include an isotropic etching.

In yet other embodiments, after etching the spacer, portions of the oxide layer disposed between the spacer and an edge of the bottom surface of the opening may remain intact.

In further embodiments, the methods may further include, after forming of the semiconductor layer in the opening, successively patterning the sacrificial layers and the insulating layers to form a trench defining sacrificial patterns and insulating patterns which are alternatingly and repeatedly stacked, removing the sacrificial patterns exposed to the trench to form recess regions, forming an information storage layer in the recess region, and forming gates respectively filling the recess regions.

In still further embodiments, the forming of the spacer may include conformally forming a spacer precursor layer on the substrate having the opening, and anisotropically etching the spacer precursor layer.

In further embodiments, the spacer may contact sidewalls of the sacrificial layers and sidewalls of the insulating layers exposed by the opening.

In yet further embodiments, the spacer may be formed of a semiconductor material.

In other embodiments, the spacer and the semiconductor layer may be in an amorphous state, and the methods may further include crystallizing the spacer and the semiconductor layer.

In still other embodiments, crystallizing the spacer and the semiconductor layer may include at least one of irradiating a laser beam to the spacer and the semiconductor layer, or supplying heat to the spacer and the semiconductor layer.

A semiconductor device according to some embodiments of the inventive concepts include gate electrodes and insulating patterns alternatingly and repeatedly stacked on a substrate, a semiconductor pillar penetrating the insulating patterns and the gate electrodes and contacting the insulating patterns, and an information storage layer disposed between the semiconductor pillar and the gate electrodes. A central portion of a bottom surface of the semiconductor pillar contacts the substrate, and an edge of the bottom surface of the semiconductor pillar is spaced apart from the substrate.

In some embodiments, the above semiconductor device may further include an insulating layer disposed between the edge of the bottom surface of the semiconductor pillar and the substrate.

In further embodiments, the insulating layer may be a native oxide layer.

In still further embodiments, the semiconductor pillar may include a first portion disposed on the oxide layer and extending in a direction vertical to a top surface of the substrate and a second portion contacting the top surface of the substrate and extending in the direction vertical to the top surface of the substrate. The first portion contacts the insulating patterns and the information storage layer, and the second portion is spaced apart from the insulating patterns and the information storage layer.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings:

FIG. 2 is a flow diagram for illustrating methods for fabricating a semiconductor pillar included in a semiconductor device according to some embodiments of the inventive concepts;

DETAILED DESCRIPTION OF THE EMBODIMENTS

Figure 1A:
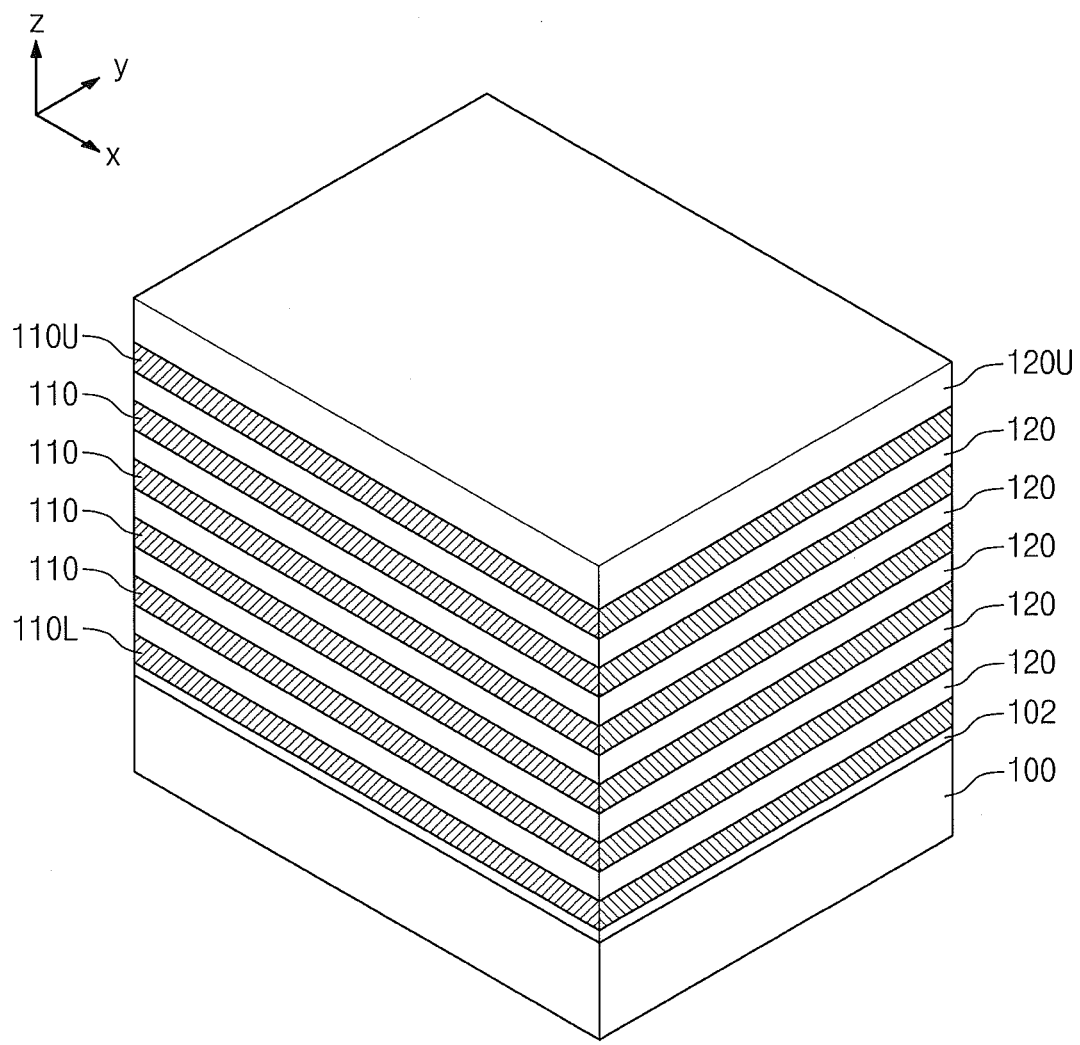
FIGS. 1A through 1L are perspective views for illustrating methods for fabricating a semiconductor device according to some embodiments of the inventive concepts.

Exemplary embodiments of the inventive concepts will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

In the following description, these terms are only used to distinguish one element from another element. It will also be understood that when a layer (or film) is referred to as being 'on' another layer or substrate, it can be directly on the other layer or substrate, or intervening layers may also be present. In the figures, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. The word 'and/or' means that one or more or a combination of relevant constituent elements is possible. Like reference numerals refer to like elements throughout.

Hereinafter, a method for fabricating a semiconductor device according to an embodiment of the inventive concepts will be described in detail with the accompanying drawings. FIGS. 1A through 1L perspective views for illustrating a method for fabricating a semiconductor device according to an embodiment of the inventive concepts.

Referring to FIGS. 1A and 2, a substrate 100 is prepared. The substrate 100 may be a semiconductor substrate. For example, the substrate 100 may be a silicon substrate, a germanium substrate, a silicon-germanium substrate, a compound semiconductor substrate, or the like. The substrate 100 may be doped with first type dopants.

Sacrificial layers 110L, 110, 110U and insulating layers 120, 120U may be alternatingly and repeatedly stacked on the substrate 100 (S10). The sacrificial layers 110L, 110, 110U may be formed of a material having an etch selectivity with respect to the insulating layers 120, 120U. For example, the insulating layers 120, 120U may be formed of an oxide, and the sacrificial layers 110L, 110, 110U may include a nitride and/or an oxynitride. Preferably, the sacrificial layers 110L, 110, 110U are formed of the same material. Likewise, the insulating layers 120, 120U are preferably formed of the same material.

The sacrificial layers 110L, 110, 110U may be formed at the same thickness. Unlike this, among the sacrificial layers 110L, 110, 110U, the lowermost sacrificial layer 110L and the uppermost sacrificial layer 110U may be formed thicker than the sacrificial layers 110 between the lowermost sacrificial layer 110L and the uppermost sacrificial layer 110U. In this case, the sacrificial layers 110 between the lowermost sacrificial layer 110L and the uppermost sacrificial layer 110U may be formed at the same thickness. Among the insulating layers 120, 120U, the uppermost insulating layer 120U may be formed thicker than the underlying insulating layers 120. The insulating layers 120 underlying the uppermost insulating layer 120U may be formed at the same thickness.

Prior to forming the sacrificial layers 110L, 110, 110U and the insulating layers 120, 120U, a buffer dielectric layer 102 may be further formed on the substrate 100. The sacrificial layers 110L, 110, 110U and the insulating layers 120, 120U may be formed on the buffer dielectric layer 102. The lowermost sacrificial layer 110L may be formed directly on the buffer dielectric layer 102. Preferably, the buffer dielectric layer 102 is formed of a dielectric material having an etch selectivity with respect to the sacrificial layers 110L, 110, 110U. For example, the buffer dielectric layer 102 may be formed of an oxide layer, particularly, a thermal oxide layer.

Figure 1B:
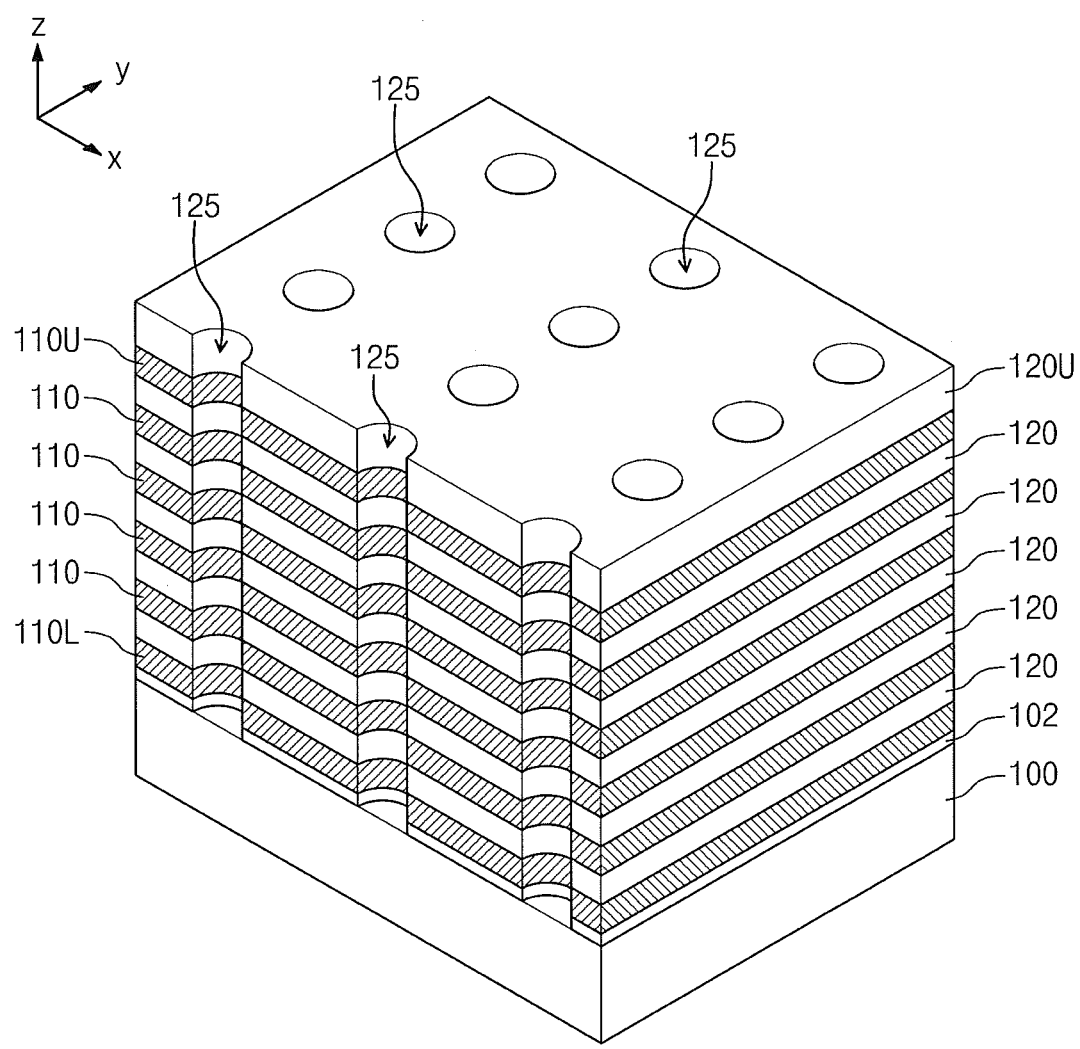

Referring to FIGS. 1B and 2, channel openings 125 successively penetrating the insulating layers 120U, 120, the sacrificial layers 110U, 110, 110L, and the buffer dielectric layer 102 may be formed (S20). Preferably, bottom surfaces of the channel openings 125 may be some of a top surface of the substrate 100. Directly after forming the channel openings 125, the bottom surfaces of the channel openings 125 may be exposed. The channel openings 125 may be formed by using an anisotropic etch process. The channel openings 125 may have a hole shape. The channel openings 125 may be spaced apart from one another. The channel openings 125 may be arranged two-dimensionally along a first direction and a second direction perpendicular to the first direction. The first direction and the second direction are parallel to the top surface of the substrate 100. In the figures, an x-axis direction may correspond to the first direction, and a y-axis direction may correspond to the second direction. The channel openings 125 may be circular, elliptical or polygonal in plan view.

Figure 1C:
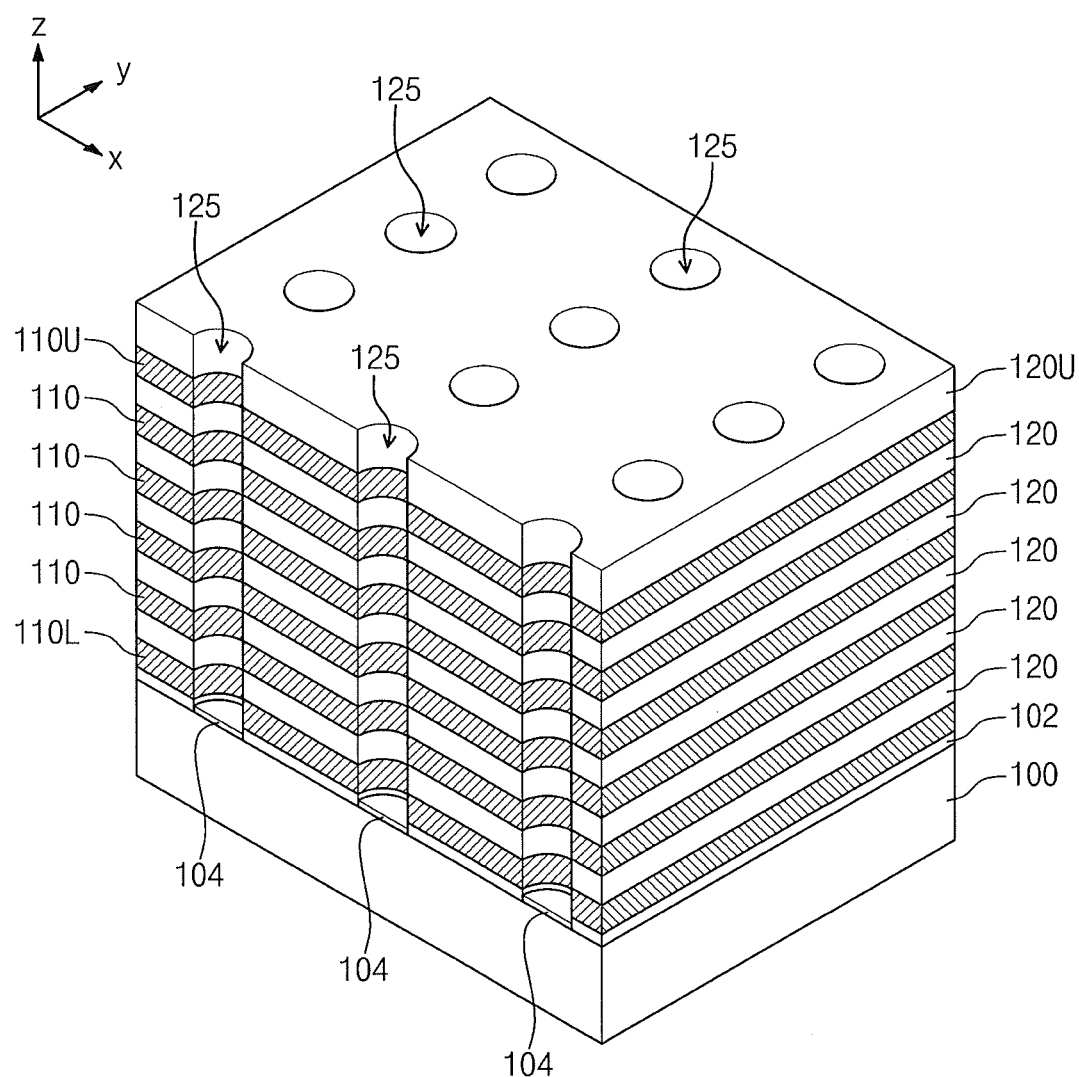

Referring to FIGS. 1C and 2, an insulating layer 104 may be generated on the bottom surfaces of the channel openings 125 (S30). The insulating layer 104 may be generated while the resultant substrate 100 is transferred from an equipment for forming the channel openings 125 to an equipment for depositing a layer. The insulating layer 104 may be a native oxide layer generated by reacting the bottom surface of the channel openings 125 with oxygen in the atmosphere. For convenience, the insulating layer will be referred to herein as an "oxide layer" although it will be appreciated that other types of insulating materials may be used. In the case where the substrate 100 includes silicon, the oxide layer 104 may be a silicon oxide. The oxide layer 104 may cover all and/or some of the bottom surfaces of the channel openings 125. The oxide layer 104 may have a thickness which is thinner than that of the buffer dielectric layer 102.

Figure 1D:
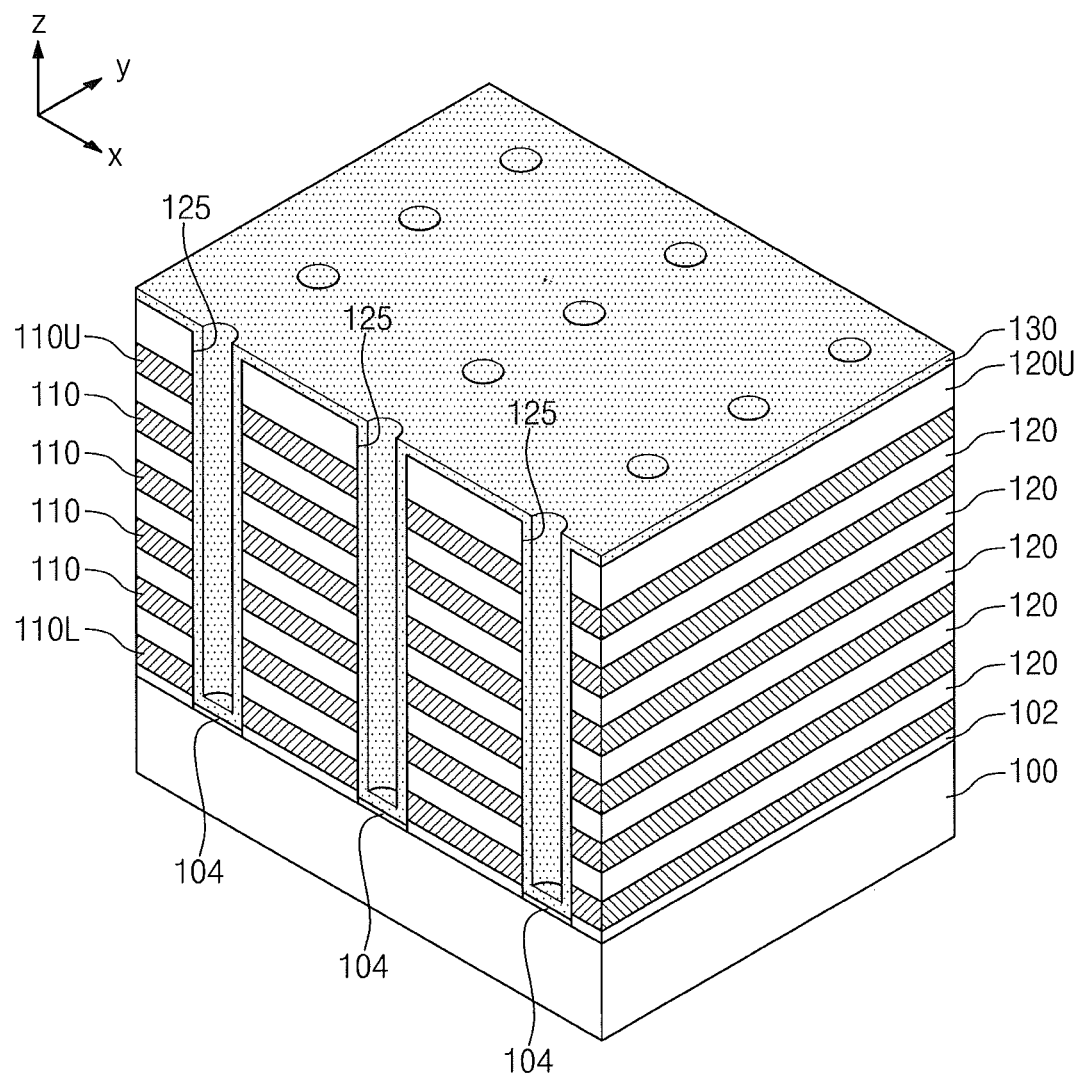

Referring to FIG. 1D, a spacer layer 130 may be conformally formed on the substrate 100 having the channel openings 125. The spacer layer 130 may be formed in the channel openings 125, and may conformally cover the oxide layer 104 on the bottom surfaces of the channel openings 125 and sidewalls of the channel openings 125. The spacer layer 130 may conformally cover the top surface of the uppermost insulating layer 120U. Due to the oxide layer 104 between the spacer layer 130 and the bottom surfaces of the channel openings 125, the spacer layer 130 may be spaced apart from the bottom surfaces of the channel openings 125. The spacer layer 130 may contact the sacrificial layers 110L, 110, 110U and the insulating layers 120, 120U constituting the sidewalls of the channel openings 125. The spacer layer 130 may have a thickness which is substantially constant. Preferably, the thickness of the spacer layer 130 is smaller than half of a width of the channel opening 125. The spacer layer 130 is preferably formed of a semiconductor material. The spacer layer 130 may be in an amorphous state. The spacer layer 130 may be formed by using any one of a chemical vapor deposition (CVD) and an atomic layer deposition (ALD).

Figure 1E:
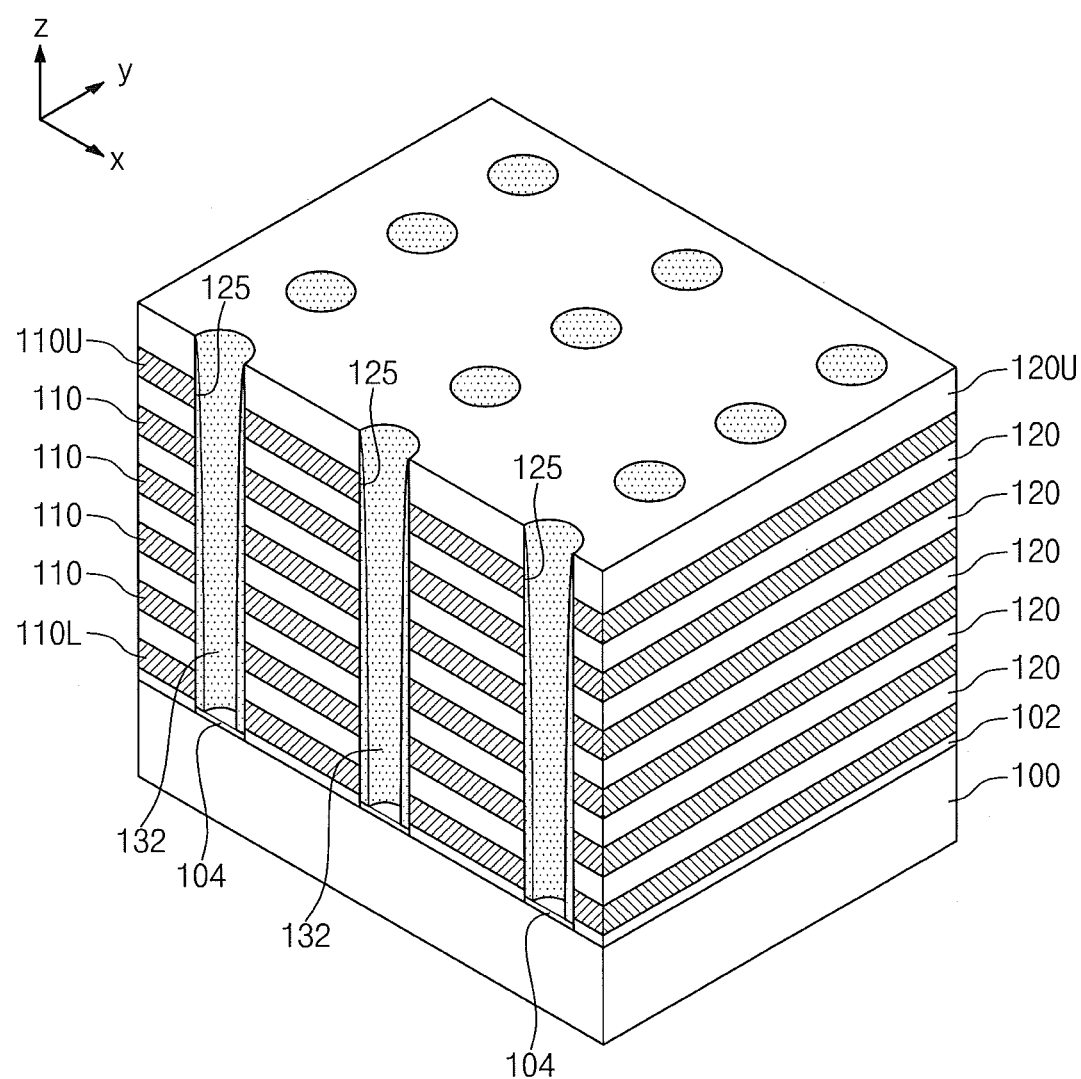

Referring to FIGS. 1E and 2, a spacer 132 may be formed on an edge of the oxide layer 104 such that the channel openings 125 expose some of the oxide layer 104 (S40). By anisotropically etching the spacer layer 130, the spacer layer 130 on a central portion of the oxide layer 104, and the spacer layer 130 on the uppermost insulating layer 120U are removed, so that the spacer 132 covering the sidewalls of the channel openings 125 and the edge of the oxide layer 104 may be formed. After the spacer 132 is formed, the central portion of the oxide layer 104 is exposed by the channel openings 125. The spacer 132 may cover the sidewalls of the channel openings 125. The spacer 132 may contact the sacrificial layers 110L, 110, 110U and the insulating layers 120, 120U constituting the sidewalls of the channel openings 125. Due to the oxide layer 104 between the spacer 132 and the substrate 100, the substrate 100 may be spaced apart from the spacer 132. The spacer 132 may have an upper width which is smaller than a lower width thereof. The width of the spacer 132 may be increased as it goes from a top of the spacer 132 to a bottom of the spacer 132.

Figure 1F:
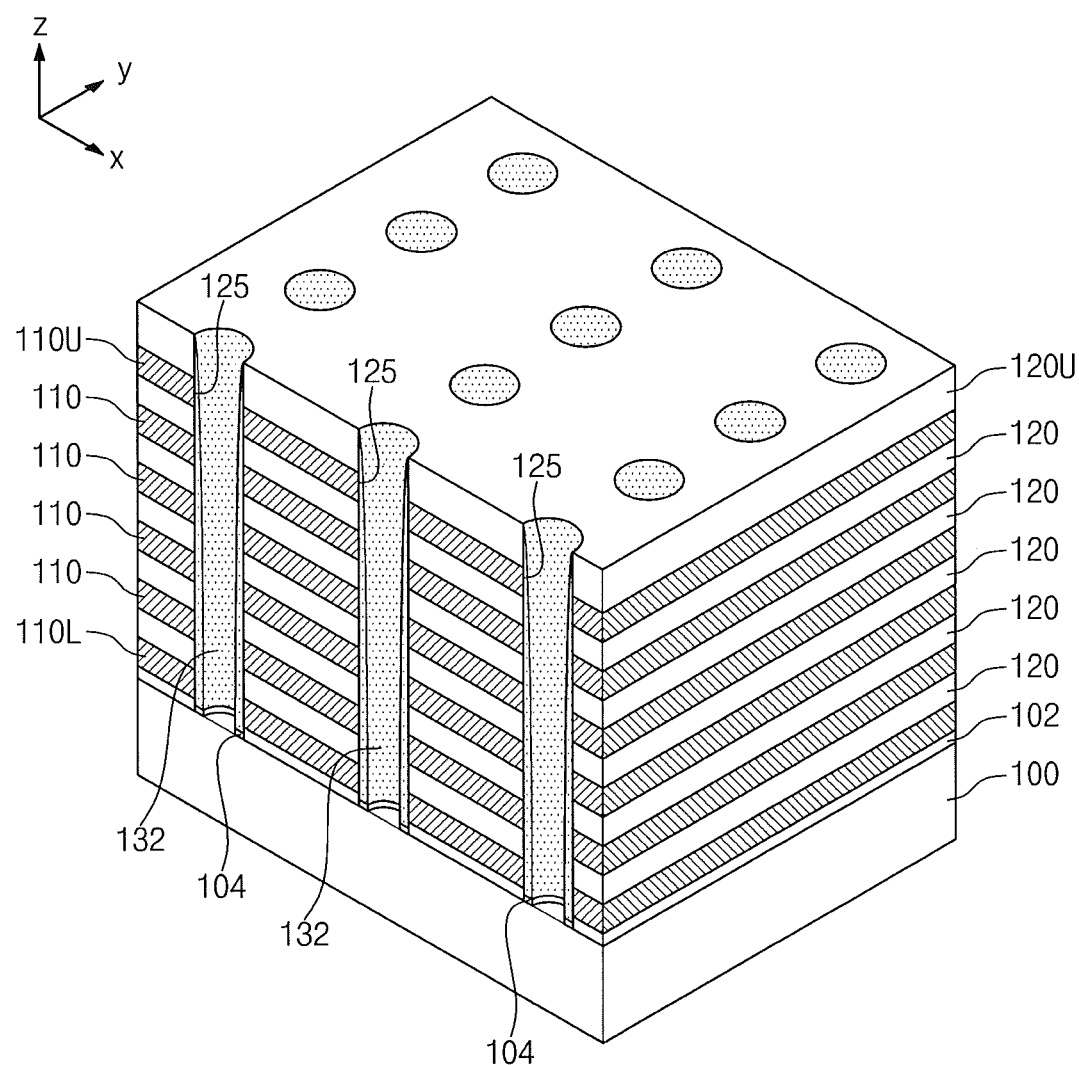

Referring to FIGS. 1F and 2, the substrate 100 having the spacer 132 is subject to a pre-cleaning (S50). By the pre-cleaning, the central portion of the oxide layer 104 exposed by the channel openings 125 may be at least removed to expose at least some of the bottom surfaces of the channel openings 125. According to an embodiment of the inventive concepts, by the pre-cleaning, the central portion of the oxide layer 104, which is not covered by the spacer 132, may be removed, and the edge portion of the oxide layer 104, which is covered by the spacer 132, may be left. The pre-cleaning may be an isotropic etching or anisotropic etching. In the case where the pre-cleaning is an anisotropic etching, after the pre-cleaning is performed, some of the oxide layer 104 positioned below the spacer 132 may be left.

Figure 1G:
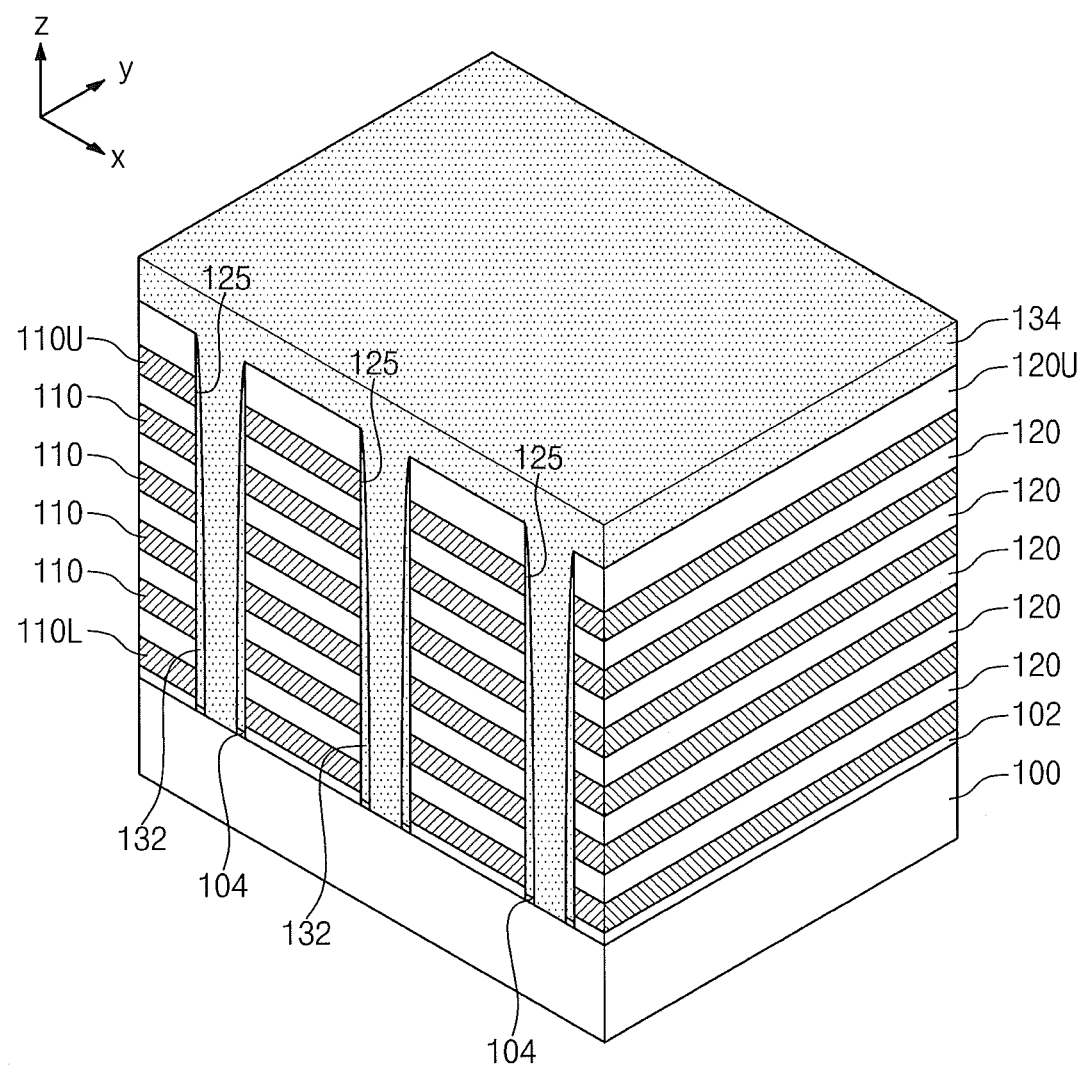

Referring to FIGS. 1G and 2, a semiconductor layer 134 contacting the bottom surfaces of the channel openings 125 may be formed in the channel openings 125 (S60). The semiconductor layer 134 may completely fill spaces in the channel openings 125 surrounded by the spacer 132. The semiconductor layer 134 may cover the top surface of the uppermost insulating layer 120U. The spacer 132 may be disposed between the semiconductor layer 134 and the sidewalls of the channel openings 125. Therefore, the semiconductor layer 134 may be spaced apart from the sidewalls of the channel openings 125. The spacer 132 may have an upper width which is smaller than a lower width thereof. Accordingly, an upper width of the space surrounded by the spacer 132 in the channel opening 125 is wider than a lower width of the space surrounded by the spacer 132. Thus, the semiconductor layer 134 may be stably filled in the channel openings 125 without any void and/or seam. The semiconductor layer 134 may be deposited by using any one of a PVD, a CVD, or an ALD. The semiconductor layer 134 may be in an amorphous state.

As above-described, before the pre-cleaning is performed, the spacer 132 is formed on the sidewalls of the channel openings 125. Accordingly, the sidewalls of the channel openings 125 are protected from the pre-cleaning.

If the pre-cleaning is performed without the spacer 132, the insulating layers 120, 120U constituting the sidewalls of the channel openings 125 may be recessed by the pre-cleaning. If the insulating layers 120, 120U constituting the sidewalls of the channel openings 125 are recessed, an irregular pattern is formed on the sidewalls of the channel openings 125, so that a void may be formed in semiconductor pillars filling the channel openings 125 to lower the reliability of the semiconductor device.

However, as aforementioned, according to the embodiment of the inventive concepts, the portions of the insulating layers 120, 120U constituting the sidewalls of the channel openings 125 are protected by the spacer 132 from the pre-cleaning. Thus, the channel openings 125 may be stably filled, so that a semiconductor device with excellent reliability can be realized.

Figure 1H:
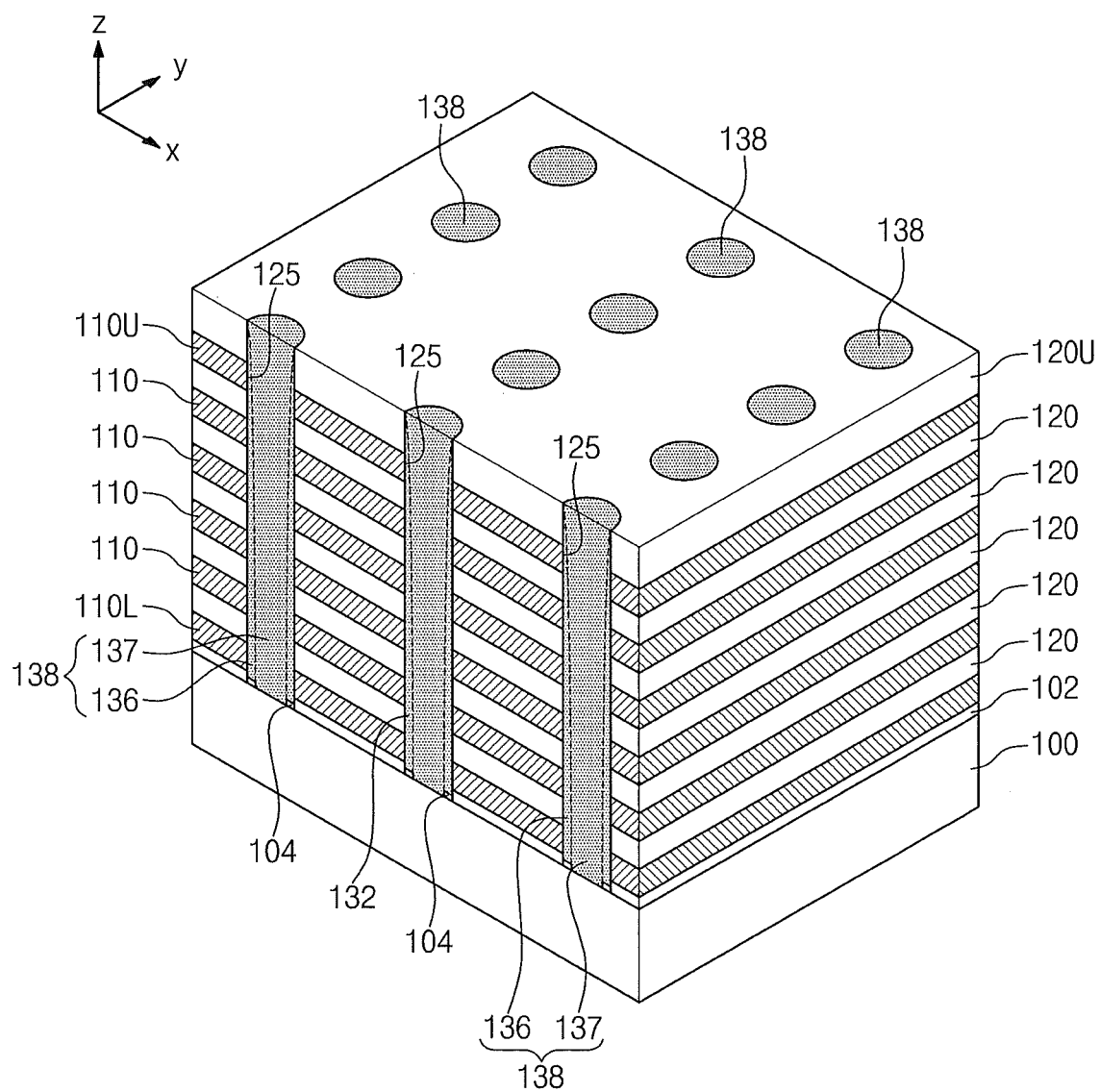

Referring to FIG. 1H, a planarizing process may be performed by using the uppermost insulating layer 120U as an etch stopper layer. The planarizing process may be performed by an etch back or chemical mechanical polishing (CMP). By the planarizing process, the semiconductor layer 134 on the uppermost insulating layer 120U may be removed. By doing so, the semiconductor layer 134 may be confined in the channel openings 125.

After the planarizing process, a process for crystallizing the semiconductor layer 134 and the spacer 132 may be performed. By the crystallizing process, the amorphous semiconductor layer 134 and the amorphous spacer 132 may be changed to a crystalline semiconductor pillar 138. The semiconductor pillar 138 may be in a single crystalline state or polycrystalline state. The crystallizing of the semiconductor layer 134 and the spacer 132 may include at least one of irradiating a laser beam to the semiconductor layer 134 and the spacer 132 or supplying heat to the semiconductor layer 134 and the spacer 132.

The semiconductor pillar 138 may include a first portion 136 and a second portion 137. The first portion 136 may be a portion of the semiconductor pillar 138 which is obtained by crystallizing the spacer 132. The first portion 136 of the semiconductor pillar 138 may be disposed on the oxide layer 104. The oxide layer 104 is disposed between the first portion 136 and the substrate 100, and thus the first portion 136 and the substrate 100 may be spaced apart from each other. The first portion 136 may contact the sacrificial layers 110L, 110, 110U and the insulating layers 120, 120U constituting the sidewall of the channel opening 125.

The second portion 137 may be a portion of the semiconductor pillar 138 which is obtained by crystallizing the semiconductor layer 134. The first portion 136 is disposed between the second portion 137 of the semiconductor pillar 138 and the sidewall of the channel opening 125, and thus the second portion 137 and the sidewall of the channel opening 125 may be spaced apart from each other. The second portion 137 may contact the top surface of the substrate 100. Although the first portion 136 and the second portion 137 of the semiconductor pillar 138 are discriminated by a dotted line in the drawings, a discontinuous boundary may not exist between the first portion 136 and the second portion 137. In this case, the first portion 136 and the second portion 137 may be one body.

Figure 1I:
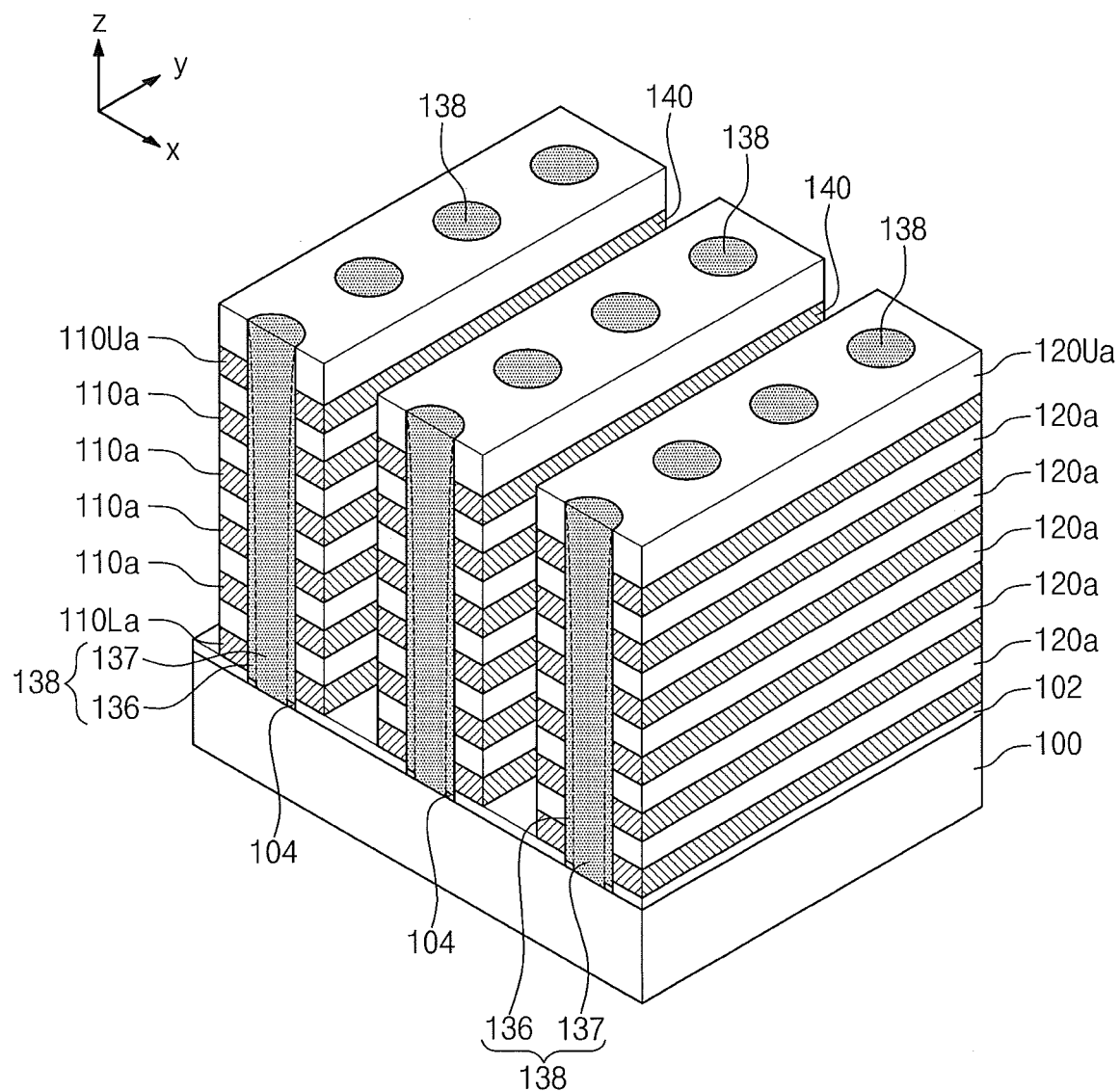

Referring to FIG. 1I, the insulating layers 120U, 120 and the sacrificial layers 110U, 110, 110L are successively patterned to form trenches 140. The trenches 140 define sacrificial patterns 110La, 110a, 110Ua and insulating patterns 120a, 120Ua, which are alternatingly and repeatedly stacked. The forming of the trenches 140 may be performed by an anisotropic etching process. The trenches 140 may extend in parallel to one another in the second direction (i.e., y-axis direction). By doing so, the sacrificial patterns 110La, 110a, 110Ua and the insulating patterns 120a, 120Ua may also have line shapes which extend in parallel to one another in the second direction (i.e., y-axis direction).

The semiconductor pillars 138, which are arranged in the first direction (i.e., x-axis direction), form a single row, and the semiconductor pillars 138, which are arranged in the second direction (i.e., y-axis direction), form a single column. A plurality of rows and a plurality of columns may be arranged on the substrate 100. Each of the trenches 140 is preferably disposed between one pair of columns adjacent to each other. The plurality of semiconductor pillars 138 included in the single column may penetrate a single stack structure including the sacrificial patterns 110La, 110a, 110Ua and the insulating patterns 120a, 120Ua which are alternatingly and repeatedly stacked.

The sacrificial patterns 110La, 110a, 110Ua and the insulating patterns 120a, 120Ua may be exposed to a sidewall of the trench 140. The buffer dielectric layer 102 may be exposed to a bottom of the trench 140. In other embodiments, if the buffer dielectric layer 102 is etched during the forming of the trenches 140, the substrate 100 may be exposed to the bottom of the trench 140. Hereinafter, for the convenience of description, an embodiment in which the bottom of the trench 140 is the buffer dielectric layer 102 will be described.

Figure 1J:
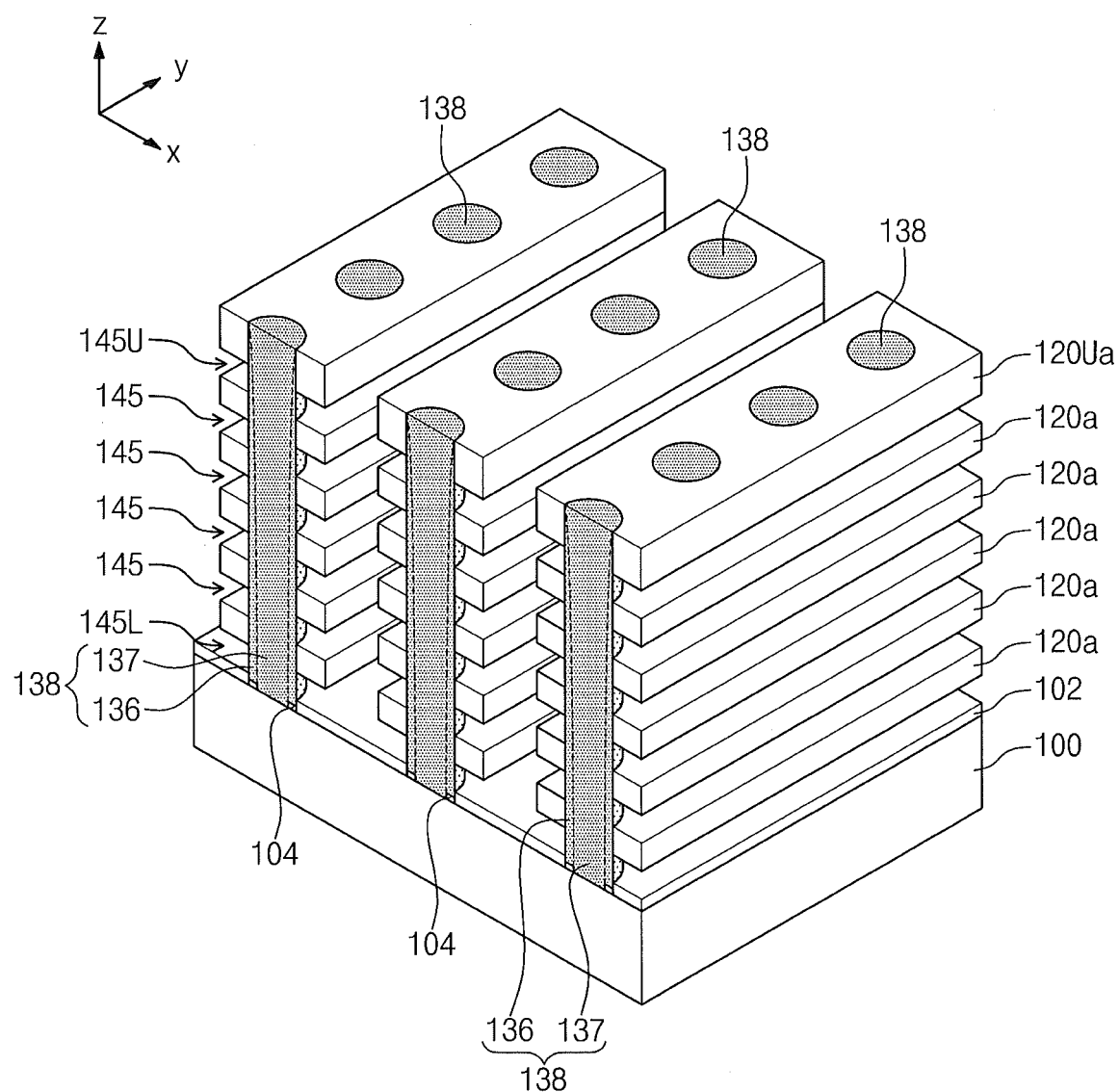

Referring to FIG. 1J, a selective etching process may be performed to remove the sacrificial patterns 110La, 110a, 110Ua exposed to the trench 140 and to thus form recess regions 145L, 145, 145U. The selective etching process is preferably an isotropic etching process. The selective etching process may be performed by a wet etching and/or dry etching. Preferably, the etch rate of the sacrificial patterns 110La, 110a, 110Ua by the selective etching process is greater than the etch rates of the insulating patterns 120a, 120Ua, the buffer dielectric layer 102 and the semiconductor pillar 138. Accordingly, after the selective etching process is performed, the insulating patterns 120a, 120Ua, the buffer dielectric layer 102 and the semiconductor pillar 138 may be left.

The recess regions 145L, 145, 145U may expose a sidewall of the first portion 136 of the semiconductor pillar 138 contacting the sacrificial patterns 110La, 110a, 110Ua. A sidewall of the second portion 137 of the semiconductor pillar 138 is surrounded by the first portion 136 of the semiconductor pillar 138, and thus the second portion 137 of the semiconductor pillar 138 may not be exposed by the recess regions 145L, 145, 145U.

Among the recess regions 145L, 145, 145U, the lowermost recess region 145L is formed by removing the lowermost sacrificial pattern 110La, and the uppermost recess region 145U is formed by removing the uppermost sacrificial pattern 110Ua. The recess regions 145 between the lowermost recess region 145L and the uppermost recess region 145U are formed by removing the sacrificial patterns 110a between the lowermost sacrificial pattern 110La and the uppermost sacrificial pattern 110Ua. A bottom surface of the lowermost recess region 145L may be provided by a portion of the buffer dielectric layer 102. In embodiments where the buffer dielectric layer 102 is omitted, the bottom surface of the lowermost recess region 145L may constitute some of the substrate 100.

Figure 1K:
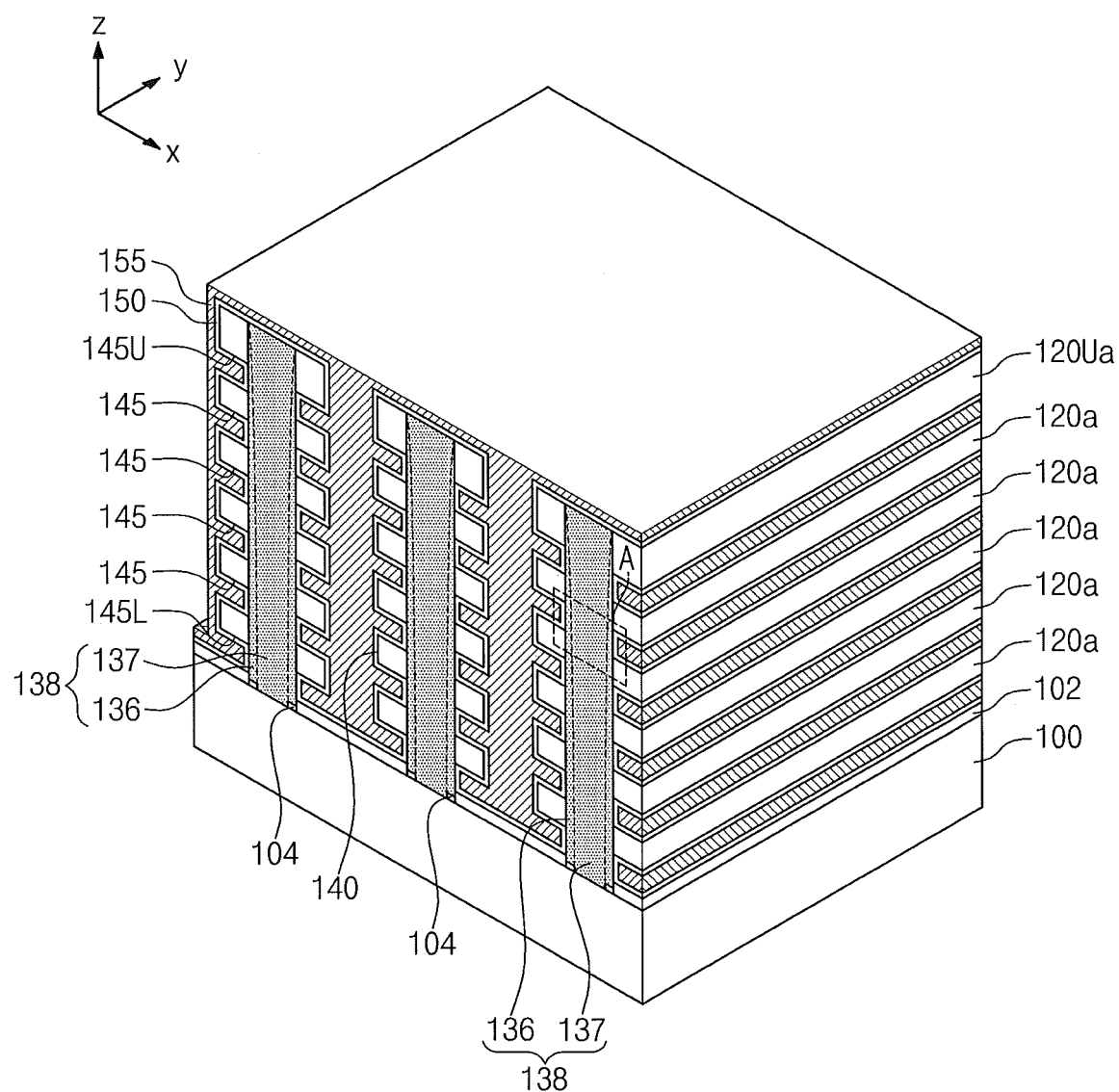

Referring to FIG. 1K, after the recess regions 145L, 145, 145U are formed, an information storage layer 150 may be formed on the substrate 100. The information storage layer 150 may be formed by using a deposition technique (e.g., a chemical vapor deposition (CVD) or atomic layer deposition) that can provide excellent step coverage. By doing so, the information storage layer 150 may be conformally formed. The information storage layer 150 may be formed at a substantially uniform thickness along inner surfaces of the recess regions 145L, 145, 145U.

Figure 3:
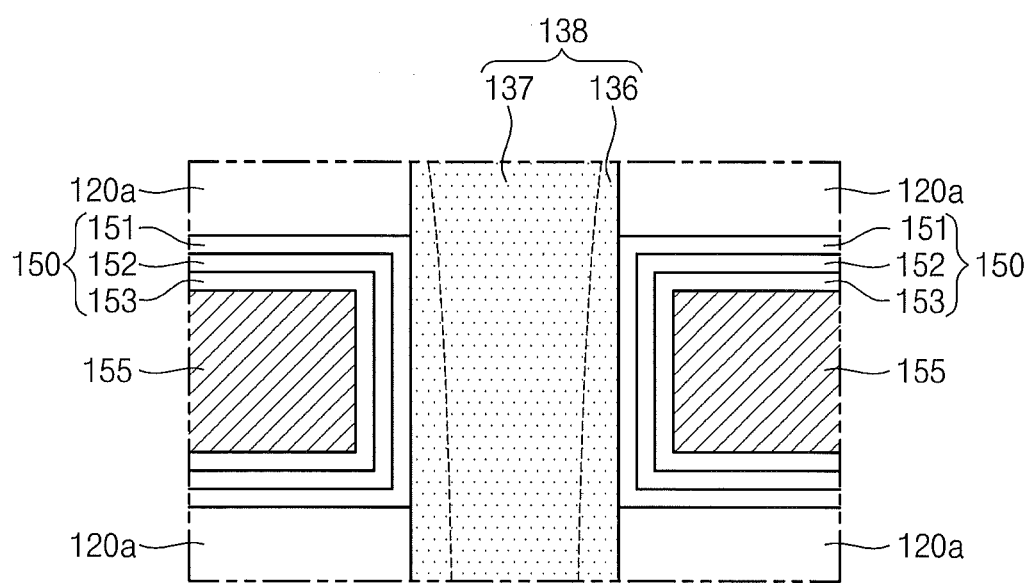
FIG. 3 is a cross-sectional view of portion A of FIG. 1K for illustrating methods for fabricating an information storage layer included in a semiconductor device according to some embodiments of the inventive concepts.

Methods of forming the information storage layer 150 will now be described. FIG. 3 is a detailed view of portion A of FIG. 1K for illustrating methods for fabricating an information storage layer included in a semiconductor device according to some embodiments of the inventive concepts.

The forming of the information storage layer 150 may include sequentially forming a tunnel dielectric layer 151, a charge storage layer 152 and a blocking layer 153. The information storage layer 150 may contact the first portion 136 of the semiconductor pillar 138 and may be spaced apart from the second portion 137 of the semiconductor pillar 138.

The tunnel dielectric layer 151 may be formed so as to cover the sidewall of the first portion 136 of the semiconductor pillar 138, which is exposed by the recess regions 145L, 145, 145U. The tunnel dielectric layer 151 may have a single layer structure or a multilayer structure. For example, the tunnel dielectric layer 151 may include at least one selected from the group consisting of a silicon oxynitride layer, a silicon nitride layer, a silicon oxide layer, or a metal oxide layer.

The charge storage layer 152 may be spaced apart from the semiconductor pillar 138 by the tunnel dielectric layer 151. The charge storage layer 152 may include charge trap sites, which can store charges. For example, the charge storage layer 152 may include at least one selected from the group consisting of a silicon nitride layer, a metal nitride layer, a metal oxynitride layer, a metal silicon oxide layer, a metal silicon oxynitride layer, or nanodots.

The blocking layer 153 may cover the charge storage layer 152. The blocking layer 153 may include at least one selected from the group consisting of a silicon oxide layer, a silicon nitride layer, a silicon oxynitride layer, or a high-k dielectric layer. The high-k dielectric layer may include at least one selected from the group consisting of a metal oxide layer, a metal nitride layer, or a metal oxynitride layer. The high-k dielectric layer may include hafnium (Hf), zirconium (Zr), aluminum (Al), tantalum (Ta), lanthanum (La), cerium (Ce), praseodymium (Pr) or the like. A dielectric constant of the blocking layer 153 may be higher than that of the tunnel dielectric layer 151.

Again referring to FIG. 1K, after the information storage layer 150 is formed, a gate conductive layer 155 may be formed on the substrate 100. The gate conductive layer 155 may fill the recess regions 145L, 145, 145U. The gate conductive layer 155 may fill the trench 160, partially or completely. The gate conductive layer 155 may be electrically separated by the information storage layer 150 from the semiconductor pillar 138 and the substrate 100. The gate conductive layer 155 may be formed by using a chemical vapor deposition, a physical vapor deposition, or an atomic layer deposition. The gate conductive layer 155 may include at least one selected from the group consisting of a metal, a metal silicide, a conductive metal nitride, or a doped semiconductor material.

Figure 1L:
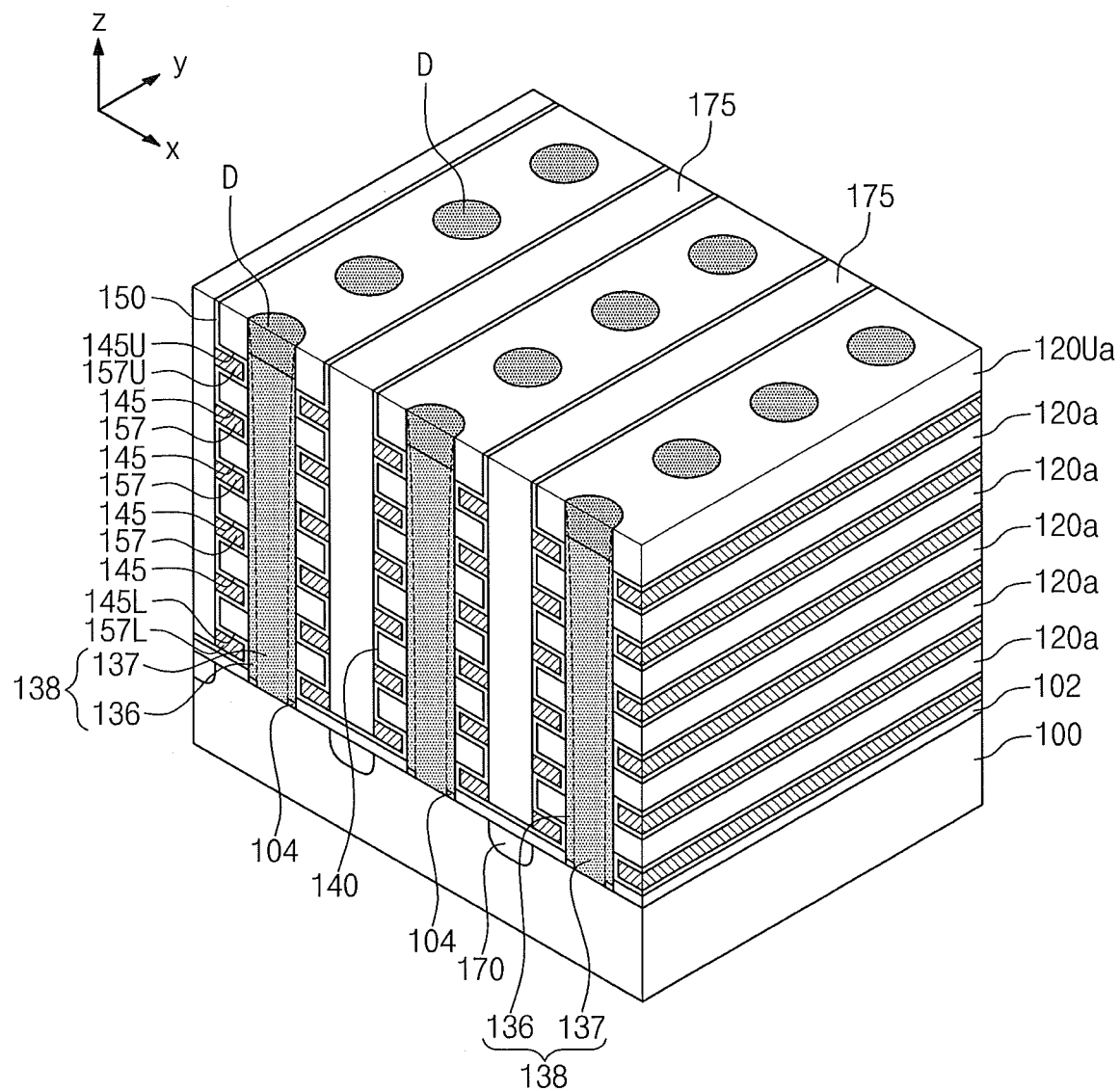

Referring to FIG. 1L, after the gate conductive layer 155 is formed, portions of the gate conductive layer 155 positioned outside the recess regions 145L, 145, 145U are removed to form gate electrodes 157L, 157, 157U in the recess regions 145L, 145, 145U. The portions of the gate conductive layer 155 positioned outside the recess regions 145L, 145, 145U may be removed by using a wet etching and/or dry etching. The gate electrodes 157L, 157, 157U, which are positioned at different layers in a third direction (i.e., z-axis direction) from the top surface of the substrate 100, may be separated from one another.

The gate electrodes 157L, 157, 157U and the insulating patterns 120a, 120Ua, which are alternatingly stacked, may be defined as a single stack structure. The plurality of stack structures extending in the second direction (i.e., y-axis direction) may be disposed spaced apart from one another on the substrate 100.

The gate electrodes 157L, 157, 157U correspond to some portions of the gate conductive layers 155 positioned in the recess regions 145L, 145, 145U, respectively. Among the gate electrodes 157L, 157, 157U, the lowermost gate electrode 157L may correspond to a gate of a lower select transistor, and the uppermost gate electrode 157U may correspond to a gate of an upper select transistor. The gate electrodes 157 between the lowermost gate electrode 157L and the uppermost gate electrode 157U may correspond to control gates of memory cells, respectively.

A common source region 170 may be formed in the substrate 100 below the bottom surface of the trench 140. The common source region 170 may have a line shape extending in the second direction (i.e., y-axis direction). The common source region 170 is a region doped with second type dopants. The common source region 170 may be formed by implanting second type dopant ions into the substrate 100. At this time, the uppermost insulating pattern 120Ua may be used as an ion implantation mask. In this case, the information storage layer 150 on the bottom surface of the trench 140, or the buffer dielectric layer 102/information storage layer 150 on the bottom surface of the trench 140 may be used as an ion implantation buffer layer.

A drain region D may be formed in an upper portion of the semiconductor pillar 138. The drain region D is doped with the second type dopants. The drain region D may be formed by providing the second type dopants to the upper portion of the semiconductor pillar 138. A bottom surface of the drain region D may be at a higher level than the top surface of the uppermost gate electrode 157U. In some other embodiments, the bottom surface of the drain region D may be at a lower level to the top surface of the uppermost gate electrode 157L. The drain region D may be formed simultaneously with the common source region 170. In some other embodiments, the drain region D may be formed prior to forming the common source region 170. In this case, the drain region D may be formed before forming the trench 140 and after forming the semiconductor pillar 138. In some other embodiments, the drain region D may be formed after forming the common source region 170.

A device isolation pattern 175 filling the trench 140 may be formed. The forming of the device isolation pattern 175 may include forming a device isolation layer on the substrate 100, and performing a planarization by using the top surface of the information storage layer 150 on the uppermost insulating pattern 120Ua as an etch stopper layer. The device isolation pattern 175 may include an insulating material. For example, the device isolation pattern 175 may be formed of a high density plasma oxide layer, a spin on glass (SOG) layer, and/or a CVD oxide layer.

After the device isolation pattern 175 is formed, the uppermost insulating pattern 120Ua may be exposed by etching the exposed information storage layer 150. At this time, the drain region D may be exposed.

A bit line (BL of FIG. 4) electrically connected with the drain region D may be formed. The bit line (BL of FIG. 4) may extend in the first direction (i.e., x-axis direction). The bit line (BL of FIG. 4) may be formed directly on the uppermost insulating pattern 120Ua and the device isolation pattern 175. Unlike this, after an interlayer dielectric layer covering the uppermost insulating pattern 120Ua and the device isolation pattern 175 is formed, the bit line (BL of FIG. 4) may be formed on the interlayer dielectric layer. In this case, the bit line (BL of FIG. 4) may be electrically in contact with the drain region D via a contact plug penetrating the interlayer dielectric layer.

Figure 4:
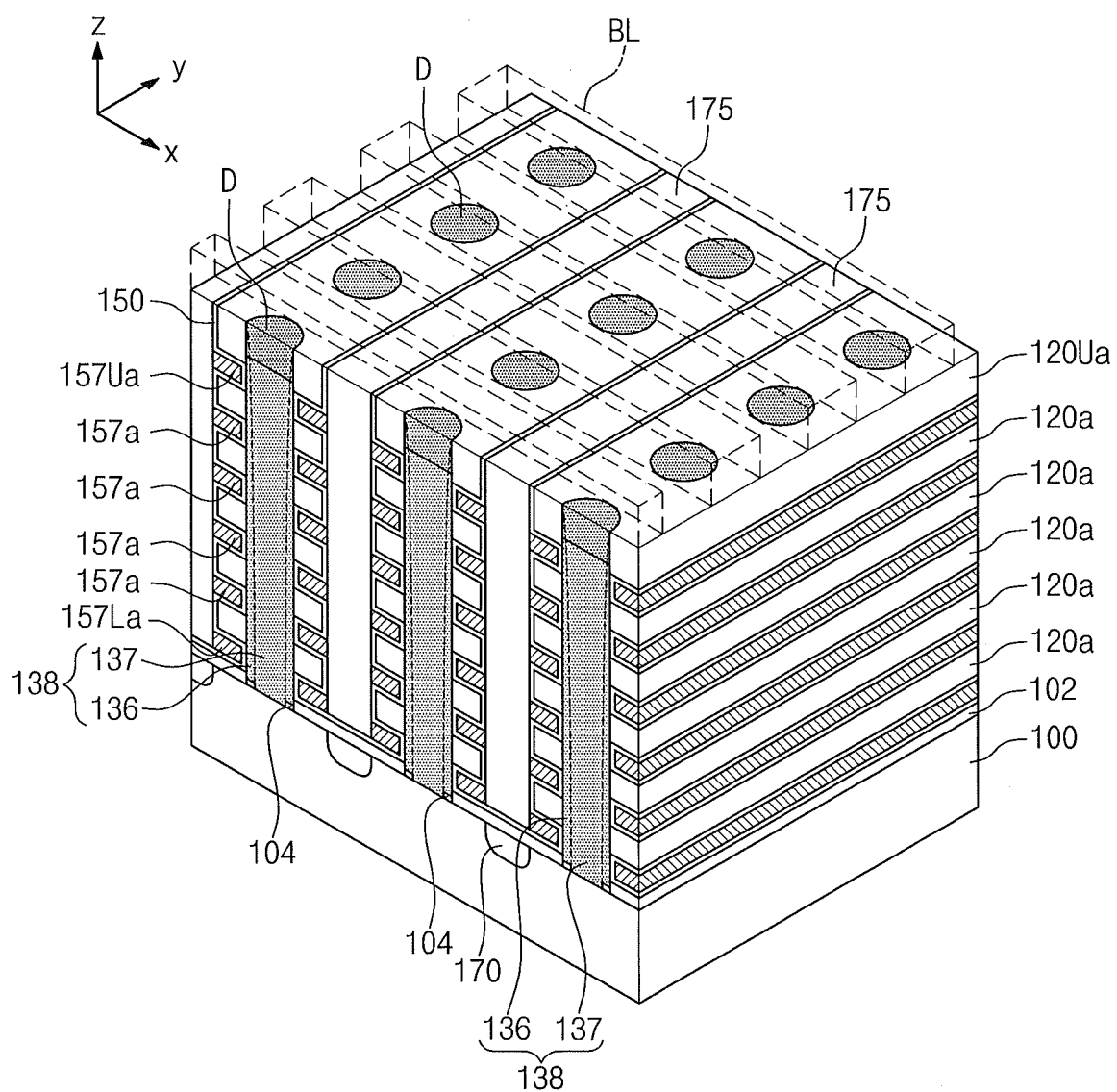
FIG. 4 is a perspective view for illustrating a semiconductor device formed by methods for fabricating a semiconductor device according to some embodiments of the inventive concepts.

Next, a semiconductor device formed by the method for fabricating a semiconductor device according to an embodiment of the inventive concepts will be described. FIG. 4 is a perspective view for illustrating a semiconductor device formed by the method for fabricating a semiconductor device according to an embodiment of the inventive concepts.

Referring to FIG. 4, a substrate 100 is prepared. The substrate 100 may be a semiconductor substrate. The substrate 100 may be a silicon substrate, a germanium substrate, a silicon-germanium substrate, a compound semiconductor substrate, or the like. The substrate 100 may be doped with first type dopants.

Gate electrodes 157L, 157, 157U and insulating patterns 120a, 120Ua may be alternatingly stacked on the substrate 100. The gate electrodes 157L, 157, 157U and the insulating patterns 120a, 120Ua, which are alternatingly stacked, may constitute a single stack structure. The plurality of stack structures may be disposed on the substrate 100. The plurality of stack structures may be spaced apart from one another in a first direction parallel to a top surface of the substrate 100. The gate electrodes 157L, 157, 157U and the insulating patterns 120a, 120Ua may extend in parallel in a second direction, which is parallel to the top surface of the substrate 100 and perpendicular to the first direction. That is, the plurality of stack structures may extend in parallel in the second direction. The first direction may correspond to an x-axis direction on the drawing, and the second direction may correspond to a y-axis direction.

The insulating patterns 120a, 120Ua may include an oxide. For example, the insulating patterns 120a, 120Ua may include a silicon oxide. The gate electrodes 157L, 157, 157U may include a conductive material. For example, the gate electrodes 157L, 157, 157U may include at least one selected from the group consisting of metals (e.g., tungsten (W), aluminum (Al), titanium (Ti), tantalum (Ta), etc.), conductive metal nitrides (e.g., titanium nitride, tantalum nitride, etc.), or doped semiconductor materials (e.g., doped silicon, doped germanium, doped silicon germanium, etc.).

A device isolation pattern 175 may be disposed between the stack structures adjacent to each other. In other words, the device isolation pattern 175 may be disposed on the substrate 100 at one side of the gate electrodes 157L, 157, 157U and the insulating patterns 120a, 120Ua which are alternatingly and repeatedly stacked. The device isolation pattern 175 may include a silicon oxide layer.

A semiconductor pillar 138 penetrates the gate electrodes 157L, 157, 157U and the insulating patterns 120a, 120Ua which are alternatingly and repeatedly stacked. The semiconductor pillar 138 may extend in a third direction vertical to the first direction and the second direction. The third direction is a direction vertical to the top surface of the substrate 100. The third direction may correspond to a z-axis direction on the drawing. The semiconductor pillar 138 may be provided in plurality on the semiconductor substrate 100. The plurality of semiconductor pillars 138 may be arranged two-dimensionally in the first direction and the second direction. The plurality of semiconductor pillars 138 may penetrate the respective stack structures. The plurality of semiconductor pillars 138 penetrating the respective stack structures may be spaced apart from one another in the second direction. A drain region D may be disposed in an upper portion of the semiconductor pillar 138. The drain region D may be a region doped with second type dopants. The semiconductor pillar 138 may be a single crystalline semiconductor or polycrystalline semiconductor.

Some of a bottom surface of the semiconductor pillar 138 contacts the substrate 100, and the other of the bottom surface of the semiconductor pillar 138 may be spaced apart from the substrate 100. For example, a central portion of the bottom surface of the semiconductor pillar 138 contacts the substrate 100, and an edge of the bottom surface of the semiconductor pillar 138 may be spaced apart from the substrate 100. Between the edge of the bottom surface of the semiconductor pillar 138 spaced apart from the substrate 100, and the substrate 100, an oxide layer 104 may be disposed. The oxide layer 104 may be a native oxide layer.

The semiconductor pillar 138 may include a first portion 136 and a second portion 137. The first portion 136 may be a portion of the semiconductor pillar 138 which is disposed on the oxide layer 104 and spaced from the substrate 100. The first portion 136 may contact an information storage layer 150 and the insulating patterns 120Ua, 120a. The second portion 137 may be a portion of the semiconductor pillar 138 which contacts the substrate 100 and is spaced apart from the information storage layer 150 and the insulating patterns 120Ua, 120a. Although the first portion 136 and the second portion 137 of the semiconductor pillar 138 are discriminated by a dotted line in the drawings, a discontinuous boundary may not exist between the first portion 136 and the second portion 137.

Each of the semiconductor pillars 138, the gate electrodes 157L, 157, 157U surrounding each of the semiconductor pillars 138, and the information storage layer 150 between each of the semiconductor pillars 138 and the gate electrodes 157L, 157, 157U are included in a single vertical cell string. The vertical cell string may include a lower select transistor, a plurality of memory cells, and an upper select transistor, which are connected in series to one another and are stacked. Among the gate electrodes 157L, 157, 157U, the lowermost gate electrode 157L corresponds to a gate of the lower select transistor, the uppermost gate electrode 157U corresponds to a gate of the upper select transistor. The gate electrodes 157 between the lowermost gate electrode 157L and the uppermost gate electrode 157U correspond to gates of the memory cells, respectively.

The information storage layer 150 may include a tunnel dielectric layer 151, a charge storage layer 152, and a blocking layer 153, as described with reference to FIG. 3. The information storage layer 150 positioned between the gate electrode 157 and the semiconductor pillar 138 corresponds to a data storage element of the memory cell. The information storage layer 150 between the lowermost gate electrode 157L and the semiconductor pillar 138 may be included in a first gate dielectric layer of the lower select transistor, and a buffer dielectric layer 102 and the information storage layer 150 between the lowermost gate electrode 157L and the substrate 100 may be included in a second gate dielectric layer of the lower select transistor. The information storage layer 150 between the uppermost gate electrode 157U and the semiconductor pillar 138 may be included in a gate dielectric layer of the upper select transistor.

The uppermost gate electrodes 157U included in the respective stack structures may be electrically separated. The gate electrodes 157 positioned at the same distance in the third direction from the substrate 100 may be electrically connected to one another. The lowermost gate electrodes 157L may be electrically connected to one another.

A common source region 170 may be disposed in the substrate 100 below the device isolation pattern 175. The common source region 170 may have a line shape extending in the second direction (i.e., y-axis direction). The common source region 170 may be a region doped with the second type dopants. The lowermost gate electrodes 157L may control an electrical connection between the common source region 170 and the semiconductor pillar 138.

A bit line BL is electrically connected to the drain region D. The uppermost gate electrodes 157U may control an electrical connection between the bit line BL and the vertical cell string. The bit line BL extends in the first direction (i.e., x-axis direction). That is, the bit line BL crosses the gate electrodes 157L, 157, 157U. The bit line BL may be disposed in plurality on the substrate 100. The plurality of bit lines BL may be parallel to one another. One bit line BL may be electrically connected to the plurality of drain regions D, which are respectively formed in the plurality of semiconductor pillars 138 constituting a single row arranged in the first direction. Unlike this, the bit line BL may be disposed on an interlayer dielectric layer disposed on the uppermost insulating pattern 120Ua and the device isolation pattern 170. In this case, the bit line BL may electrically contact the drain region D via a contact plug penetrating the interlayer dielectric layer.

In the method for fabricating a semiconductor device according to the above-described embodiment of the inventive concepts, after the pre-cleaning process, some of the oxide layer 104 disposed between the spacer 132 and the substrate 100 is left. Unlike this, the oxide layer 104 may be completely removed by the pre-cleaning process, which will be described with reference to the drawings.

Figure 5A:
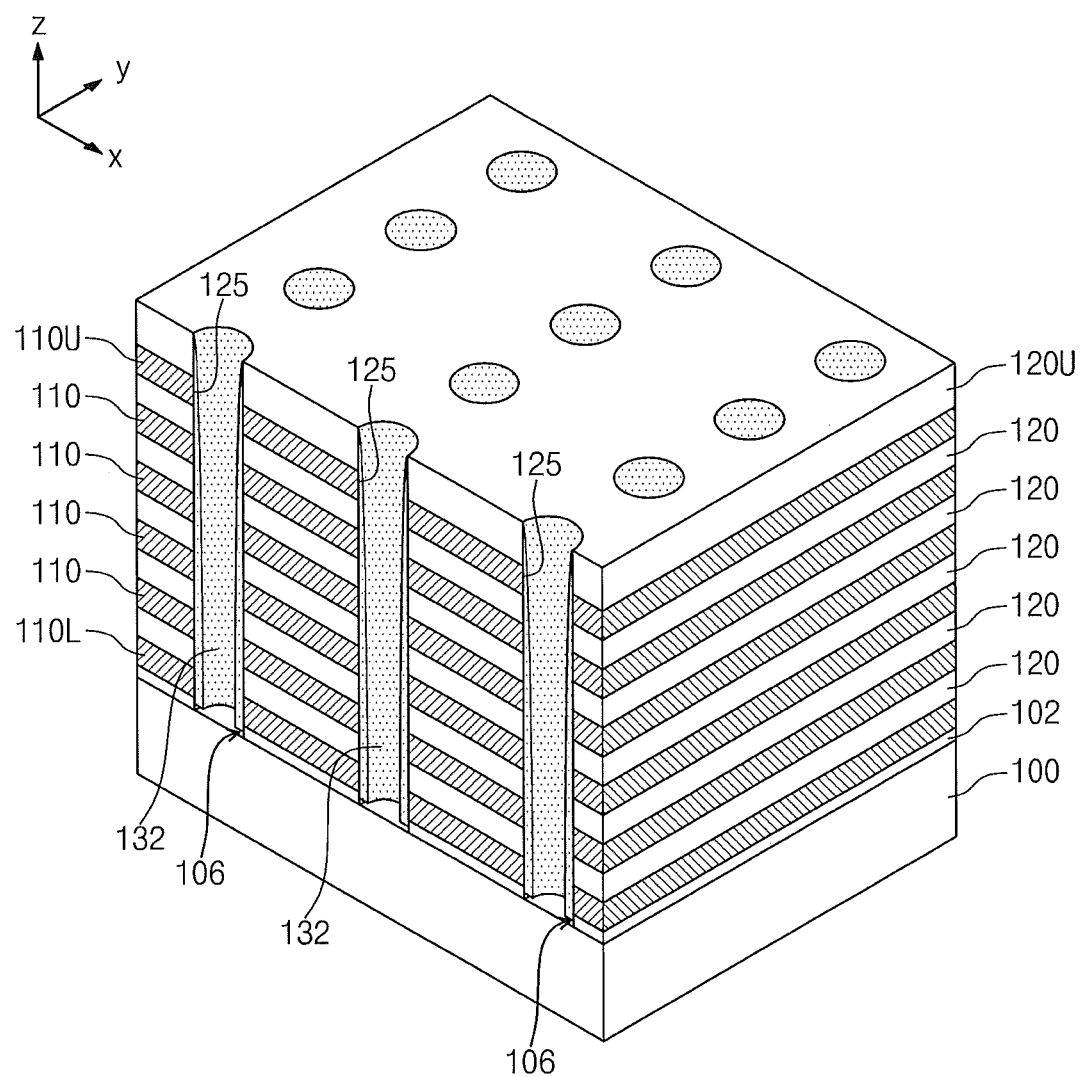
FIGS. 5A through 5B are perspective views for illustrating methods for fabricating a semiconductor device according to a further embodiments of the inventive concepts.
Figure 5B:
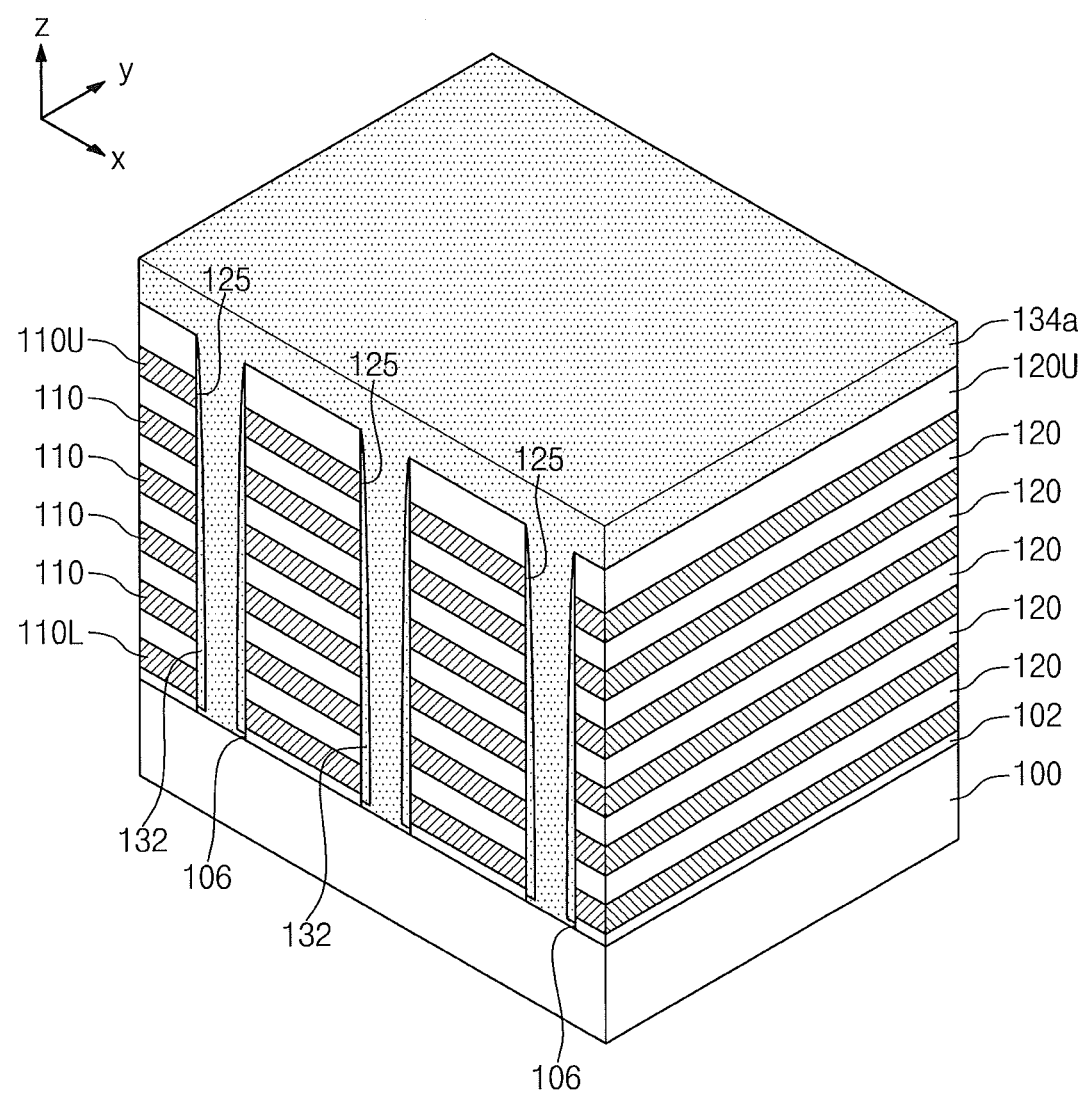

Methods of fabricating a semiconductor device according to further embodiments of the inventive concepts will be described. FIGS. 5A through 5B are perspective views for illustrating methods of fabricating a semiconductor device according to further embodiments of the inventive concepts.

Referring to FIG. 5A, as in the method described with reference to FIGS. 1A through 1E, channel openings 125 penetrating sacrificial layers 110L, 110, 110U and insulating layers 120L, 120, 120U, which are alternatingly and repeated stacked on a substrate 100, an oxide layer 104, and a spacer 132 may be provided.

The substrate 100 having the spacer 132 is subject to a pre-cleaning. By the pre-cleaning, the oxide layer 104 is completely removed, so that the entire top surface of the substrate 100 constituting bottom surfaces of the channel openings 125 may be exposed.

As the oxide layer 104 is completely removed, a vacant space 106 may be formed between a bottom surface of the spacer 132 and a top surface of the substrate 100. By the vacant space 106, the spacer 132 may be spaced apart from the substrate 100. The vacant space 106 may be defined in the channel opening 125. The vacant space 106 may expose some of the buffer dielectric layer 102 constituting a sidewall of the channel opening 125.

Referring to FIG. 5B, a semiconductor layer 134a contacting the bottom surfaces of the channel openings 125 may be formed in the channel openings 125. The semiconductor layer 134a may completely fill spaces in the channel openings 125 surrounded by the spacer 132. The semiconductor layer 134a may fill the vacant space 106. The semiconductor layer 134a may contact the entire top surface of the substrate 100 constituting the bottom surface of the channel opening 125. The semiconductor layer 134a may cover a top surface of the uppermost insulating layer 120U.

The semiconductor layer 134a may contact the buffer dielectric layer 102 exposed by the vacant space 106. The spacer 132 may be disposed between the semiconductor layer 134a, and the sacrificial layers 110L, 110, 110U and the insulating layers 120, 120U constituting a sidewall of the channel opening 125. Due to the existence of the spacer 132, the semiconductor layer 134a may be spaced apart from the sacrificial layers 110L, 110, 110U and the insulating layers 120, 120U. The spacer 132 is disposed on the semiconductor layer 134a filling the vacant space 106 and may be spaced apart from the substrate 100. The semiconductor layer 134a may be formed by using any one of a chemical vapor deposition (CVD) and an atomic layer deposition (ALD). The semiconductor layer 134a may be in an amorphous state.

Figure 6A:
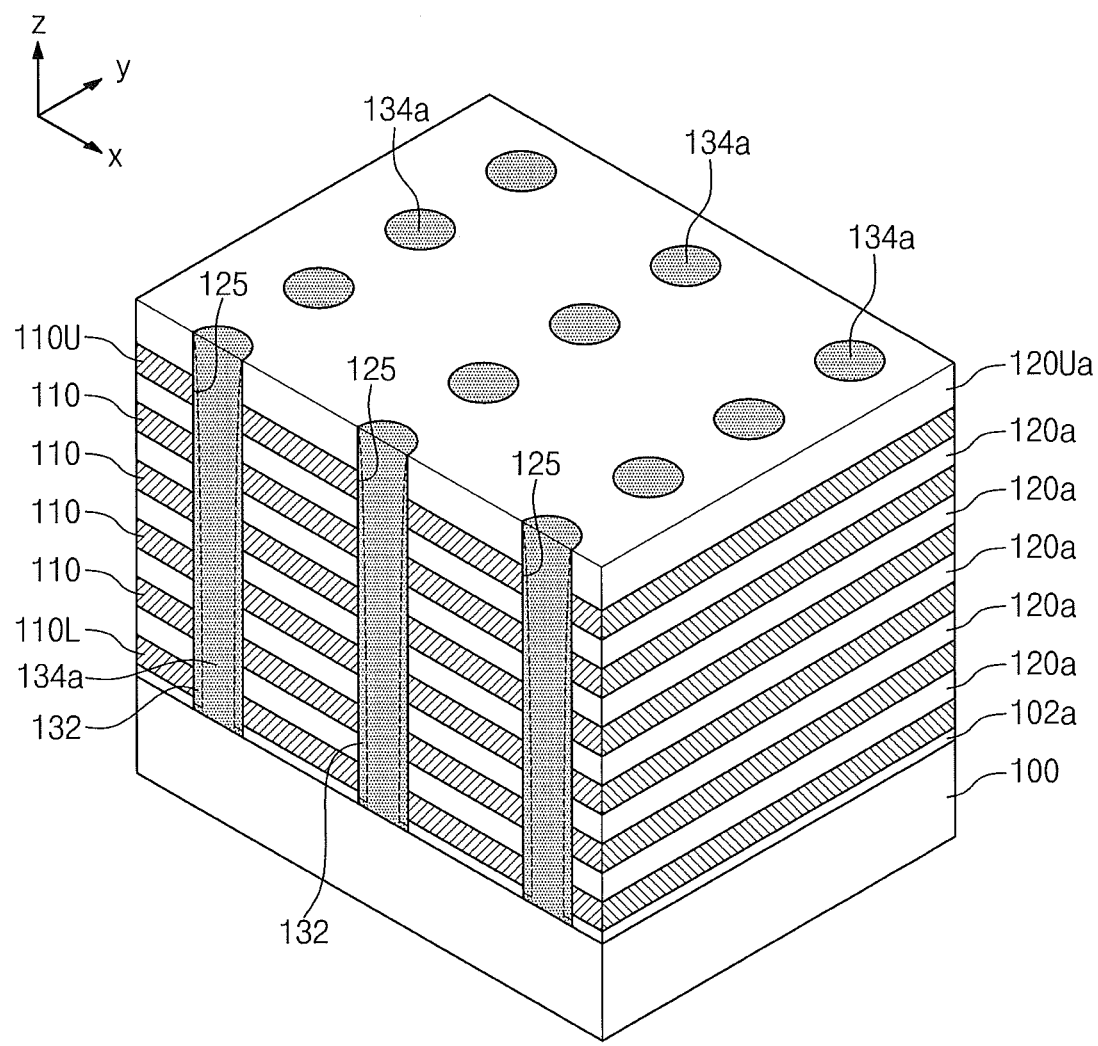
FIGS. 6A and 6B are perspective views for illustrating a semiconductor device formed by methods for fabricating a semiconductor device according to a further embodiments of the inventive concepts.
Figure 6B:
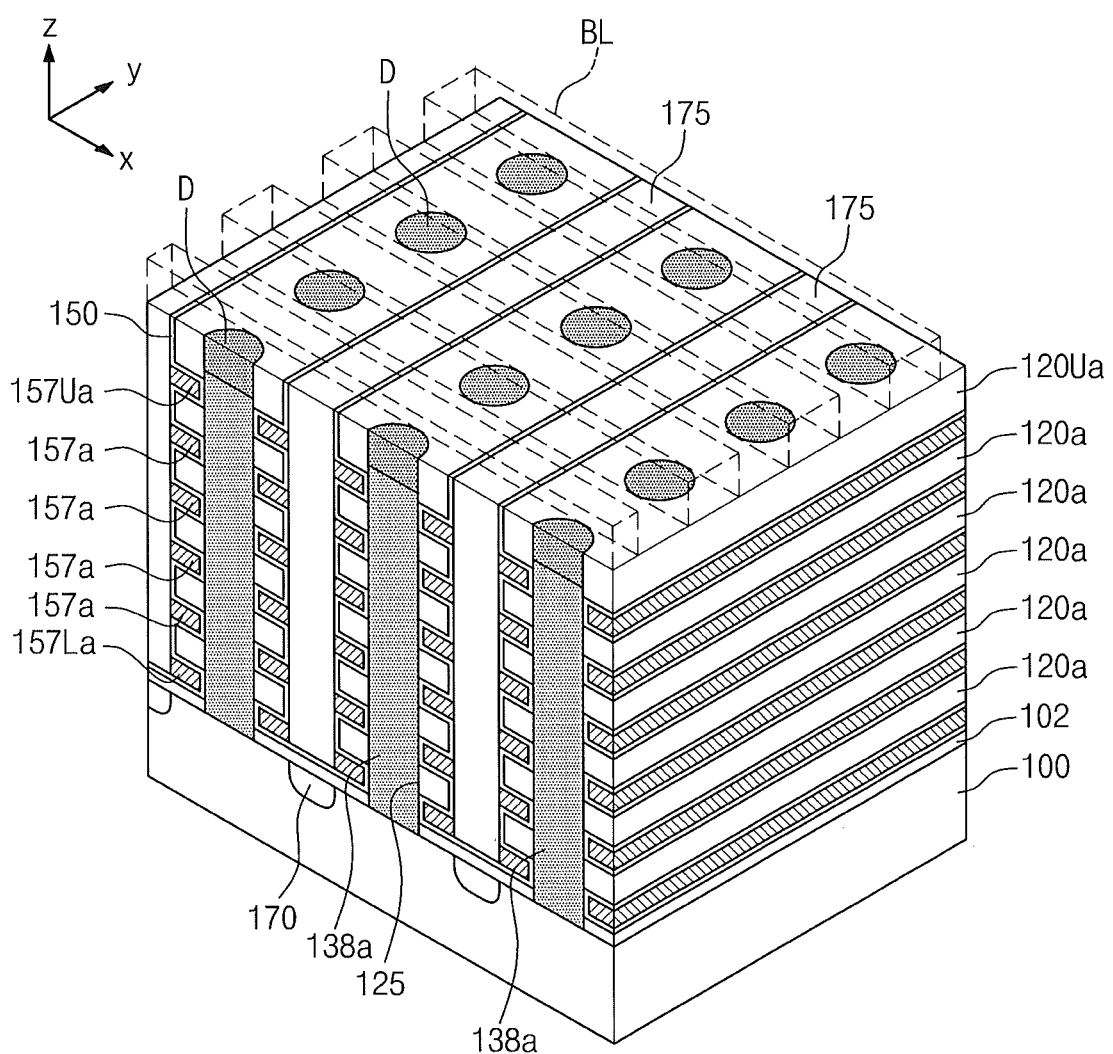

Methods for fabricating a semiconductor device according to further embodiments of the inventive concepts will be described with reference to FIGS. 6A and 6B. Referring to FIGS. 6A and 6B, a planarizing process may be performed by using the uppermost insulating layer 120Ua as an etch stopper layer. The planarizing process may be performed by an etch back or chemical mechanical polishing (CMP). By the planarizing process, portions of the semiconductor layer 134a on the uppermost insulating layer 120Ua may be removed. By doing so, the semiconductor layer 134a may be confined in the channel openings 125.

After the planarizing process, a process for crystallizing the semiconductor layer 134a and the spacer 132 may be performed. By the crystallizing process, the amorphous semiconductor layer 134a and the amorphous spacer 132 may be changed to a crystalline semiconductor pillar 138a, as shown in FIG. 6B. The semiconductor pillar 138a may be in a single crystalline state or polycrystalline state. The crystallizing of the semiconductor layer 134a and the spacer 132 may include at least one of irradiating a laser beam to the semiconductor layer 134a and the spacer 132 or supplying heat to the semiconductor layer 134a and the spacer 132.

A bottom surface of the semiconductor pillar 138a may contact the bottom surface of the channel opening 125. The entire bottom surface of the semiconductor pillar 138a may contact the top surface of the substrate 100 constituting the bottom surface of the channel opening 125.

Thereafter, the method for fabricating a semiconductor device described with reference to FIGS. 1I through 1L may be performed to provide the semiconductor device disclosed in FIGS. 6A and 6B.

A semiconductor device formed by the method for fabricating a semiconductor device according to the modified embodiment of the inventive concepts will be described. FIG. 6B is a perspective view for illustrating a semiconductor device formed by the method for fabricating a semiconductor device according to a modified embodiment of the inventive concepts.

Referring to FIG. 6B, the semiconductor device shown in FIG. 6B is similar to that shown in FIG. 4. Therefore, like reference numerals in both drawings refer to like elements. A semiconductor pillar 138a may penetrate gate electrodes 157L, 157, 157U and insulating patterns 120a, 120Ua, which are alternatingly and repeatedly stacked. Unlike in the semiconductor device shown in FIG. 4, the oxide layer (104 of FIG. 4) between the semiconductor pillar 138a and the substrate 100 may not exist. Therefore, the entire bottom surface of the semiconductor pillar 138a may contact the top surface of the substrate 100.

The semiconductor devices according to the embodiments of the inventive concepts may be mounted in various types of packages. Examples of the packages of the semiconductor devices according to the embodiments of the inventive concepts may include package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline package (SOP), a shrink small outline package (SSOP), a thin small outline package (TSOP), a thin quad flat package (TQFP), a system in package (SIP), a multi chip package (MCP), a wafer-level fabricated package (WFP), a wafer-level processed package (WSP) and so on. The packages equipped with the semiconductor devices according to the embodiments of the inventive concepts may further include a controller for controlling the semiconductor device, and/or a logic device.

Figure 7:
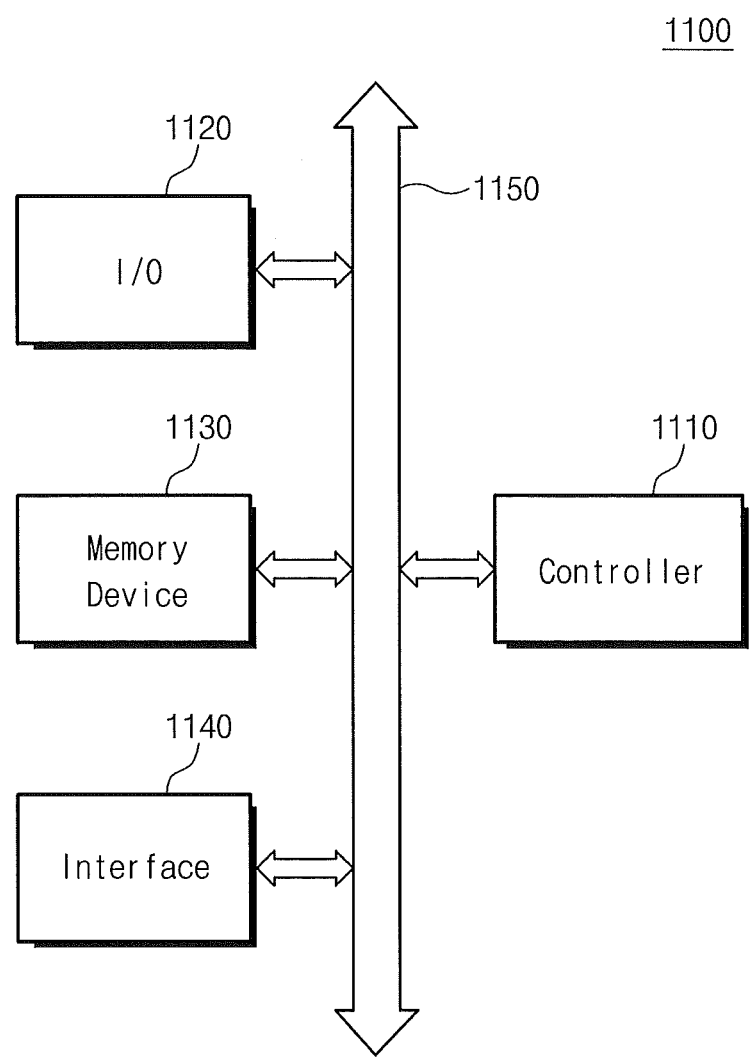
FIG. 7 is a block diagram for illustrating an electronic system including a semiconductor device according to some embodiments of the inventive concepts.

FIG. 7 is a block diagram for illustrating an electronic system including a semiconductor device according to the technical spirit of the inventive concepts.

Referring to FIG. 7, an electronic system 1100 according to embodiments of the inventive concepts includes a controller 1110, an input/output device (I/O) 1120, a memory device 1130, an interface 1140, and a bus 1150. The controller 1110, the input/output device 1120, the memory device 1130 and/or the interface 1140 may be coupled to one another through the bus 1150. The bus 1150 corresponds to a path through which data is moved.

The controller 1110 includes at least one selected from the group consisting of a microprocessor, a digital signal processor, a microcontroller, and logic devices capable of performing similar functions to the above elements. The input/output device 1120 may include a keypad, a keyboard, a display device and the like. The memory device 1130 may store data and/or commands. The memory device 1130 may include at least one among the semiconductor memory devices disclosed in the embodiments discussed above. Also, the memory device 1130 may further include other types of semiconductor devices (e.g., DRAM device and/or SRAM device). The interface 1140 may serve to transmit/receive data to/from a communication network. The interface 1140 may include a wired and/or wireless interface. For example, the interface 1140 may include an antenna and/or a wired/wireless transceiver. Although not shown in the drawings, the electronic system 1100 may further include a high speed DRAM and/or SRAM as a working memory for enhancing operations of the controller 1110.

The electronic system 1100 may be applied to a personal digital assistant (PDA), a portable computer, a web tablet, a wireless phone, a mobile phone, a digital music player, a memory card, or all electronic products capable of transmitting/receiving information in a wireless environment.

Figure 8:
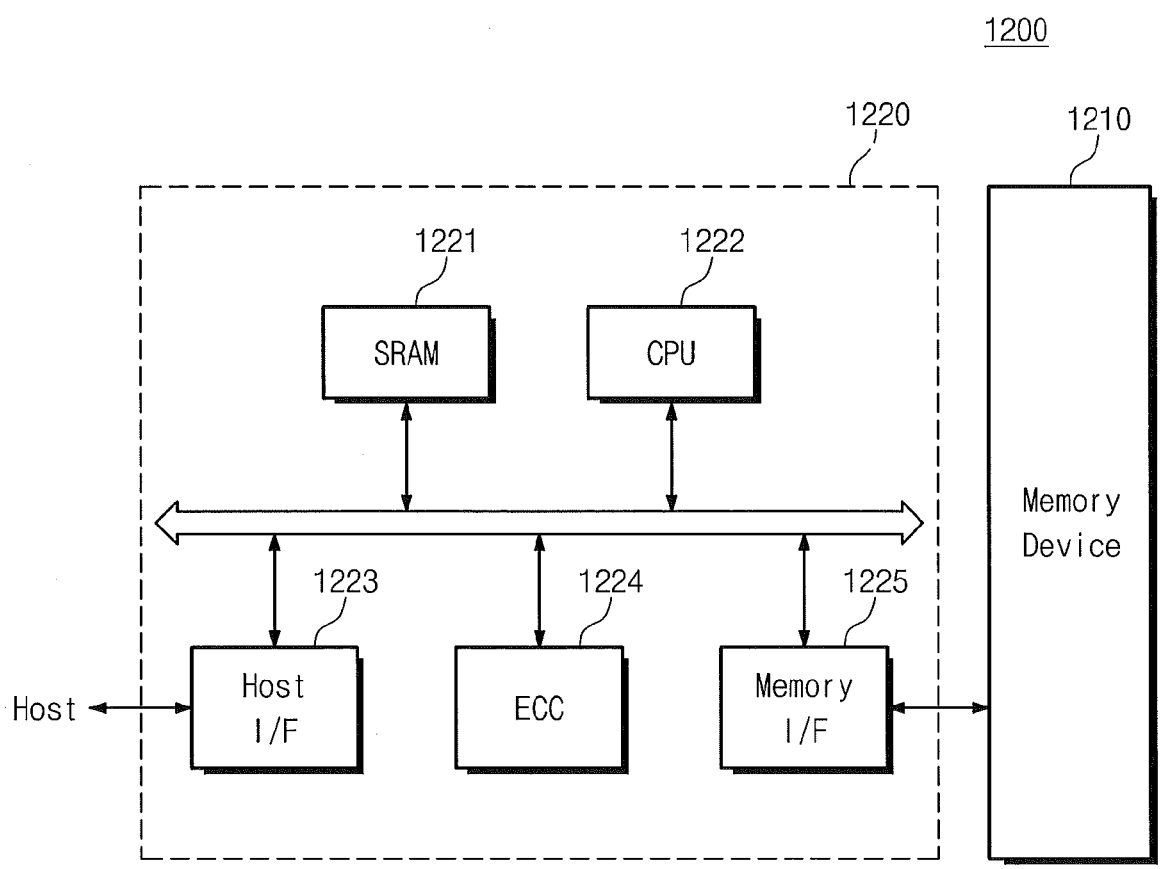
FIG. 8 is a block diagram of a memory card including a semiconductor device according to some embodiments of the inventive concepts.

FIG. 8 is a block diagram of a memory card including a semiconductor device according to the technical spirit of the inventive concepts.

Referring to FIG. 8, a memory card 1200 according to embodiments of the inventive concepts includes a memory device 1210. The memory device 1210 may include at least one among the semiconductor memory devices disclosed in the embodiments. Also, the memory device 1210 may further include other types of semiconductor memory devices (e.g., DRAM device and/or SRAM device). The memory card 1200 may include a memory controller for controlling data exchange between a host and the memory device 1210.

The memory controller 1220 may include a processing unit (CPU) 1222 controlling an overall operation of the memory card 1200. Also, the memory controller 1220 may include an SRAM 1221 used as a working memory of the processing unit 1222. In addition, the memory controller 1220 may further include a host interface 1223 and a memory interface 1225. The host interface 1223 may be provided with a data exchange protocol between the memory card 1200 and the host. The memory interface 1225 may connect the memory controller 1220 and the memory device 1210. Furthermore, the memory controller 1220 may further include an error correction block (ECC) 1224. The ECC 1224 may detect and correct an error of data read from the memory device 1210. Although not shown in FIG. 10, the memory card 1200 may further include a ROM device storing code data for interfacing with the host. The memory card 1200 may be used as a portable data storage card. Alternatively, the memory card 1200 may be provided in the form of a solid state disk (SSD) that can substitute for a hard disk of a computer system.

According to the exemplary embodiments of the inventive concepts, first material layers and second material layers which are alternatingly and repeatedly stacked, and an opening penetrating the first and second material layers are provided. Since the opening is stably filled with a semiconductor solution using a spin-on process, a semiconductor device with excellent reliability can be realized.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A method for fabricating a semiconductor device, comprising:
    alternatingly and repeatedly stacking sacrificial layers and first insulating layers on a substrate;
    forming an opening penetrating the sacrificial layers and the first insulating layers;
    forming a spacer on a sidewall of the opening wherein a bottom surface of the opening is free of the spacer;
    forming a semiconductor layer in the opening; and
    removing the sacrificial layers.

2. The method of claim 1, wherein, prior forming the spacer, a second insulating layer is formed on the bottom surface of the opening, the spacer is formed on an edge of the second insulating layer, and at least some of the second insulating layer is removed by the etching.

3. The method of claim 2, wherein the second insulating layer comprises a native oxide layer.

4. The method of claim 2, wherein the spacer is formed on the bottom of the opening, the method further comprising etching the spacer to expose the bottom surface of the opening beneath the spacer while leaving portions of the spacer on the sidewall of the opening.

5. The method of claim 4, wherein portions of the second insulating layer that are not covered by the portions of the spacer on the sidewall of the opening are completely removed by the etching.

6. The method of claim 5, wherein the etching comprises an isotropic etching.

7. The method of claim 4, wherein portions of the second insulating layer disposed between the spacer and an edge of the bottom surface of the opening remain intact after the etching.

8. The method of claim 4, wherein the forming the spacer comprises:
    conformally forming a spacer precursor layer on the substrate having the opening;
    wherein etching the spacer comprises anisotropically etching the spacer precursor layer.

9. The method of claim 4, wherein etching the spacer comprises performing a pre-cleaning with respect to the substrate having the spacer.

10. The method of claim 1, after the forming the semiconductor layer in the opening, further comprising:
    before removing the sacrificial layers, successively patterning the sacrificial layers and the first insulating layers to form a trench defining sacrificial patterns and insulating patterns which are alternatingly and repeatedly stacked;
    removing the sacrificial patterns exposed to the trench to form recess regions;
    forming an information storage layer in the recess region; and
    forming gates respectively filling the recess regions.

11. The method of claim 1, wherein the spacer contacts sidewalls of the sacrificial layers and sidewalls of the insulating layers exposed by the opening.

12. The method of claim 1, wherein the spacer comprises a semiconductor material.

13. The method of claim 12, wherein the spacer and the semiconductor layer are formed in an amorphous state, and wherein the method further comprises crystallizing the spacer and the semiconductor layer.

14. The method of claim 13, wherein crystallizing the spacer and the semiconductor layer comprises at least one of irradiating a laser beam to the spacer and the semiconductor layer; or supplying heat to the spacer and the semiconductor layer.

* * * * *